United States Patent
Tailliet et al.

(10) Patent No.: US 9,245,624 B2
(45) Date of Patent: Jan. 26, 2016

(54) MEMORY DEVICE INCLUDING A SRAM MEMORY PLANE AND A NON VOLATILE MEMORY PLANE, AND OPERATING METHODS

(71) Applicant: STMicroelectronics (Rousset) SAS, Rousset (FR)

(72) Inventors: François Tailliet, Fuveau (FR); Marc Battista, Marseille (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/298,264

(22) Filed: Jun. 6, 2014

(65) Prior Publication Data

US 2014/0369120 A1      Dec. 18, 2014

(30) Foreign Application Priority Data

Jun. 12, 2013   (FR) .................................... 13 55439

(51) Int. Cl.
*G11C 14/00*     (2006.01)
*G11C 16/10*     (2006.01)

(52) U.S. Cl.
CPC ............ *G11C 14/0063* (2013.01); *G11C 16/10* (2013.01)

(58) Field of Classification Search
CPC ............................ G11C 14/00; G11C 14/0063
USPC ...................................... 365/185.08
See application file for complete search history.

(56) References Cited

U.S. PATENT DOCUMENTS

| | | | |
|---|---|---|---|
| 4,132,904 A | 1/1979 | Harari | |
| 4,467,451 A | 8/1984 | Moyer | |
| 4,980,859 A | 12/1990 | Guterman et al. | |
| 5,357,463 A | 10/1994 | Kinney | |
| 5,519,663 A | 5/1996 | Harper, Jr. et al. | |
| 5,602,776 A * | 2/1997 | Herdt et al. | 365/185.08 |
| 6,097,629 A | 8/2000 | Dietrich et al. | |
| 6,414,873 B1 * | 7/2002 | Herdt | 365/185.08 |
| 6,614,684 B1 * | 9/2003 | Shukuri et al. | 365/185.05 |
| 7,164,608 B2 | 1/2007 | Lee | |
| 8,018,768 B2 | 9/2011 | Shih et al. | |
| 8,331,150 B2 | 12/2012 | Hsu et al. | |
| 8,971,113 B2 * | 3/2015 | Lee | 365/185.08 |
| 2006/0158925 A1 * | 7/2006 | Cuppens | 365/154 |
| 2006/0193174 A1 * | 8/2006 | Choi et al. | 365/185.08 |
| 2009/0190402 A1 | 7/2009 | Hsu et al. | |
| 2009/0213664 A1 | 8/2009 | Kikuchi et al. | |
| 2014/0085978 A1 * | 3/2014 | Lee | 365/185.08 |

FOREIGN PATENT DOCUMENTS

EP           1575057 A2    9/2005

OTHER PUBLICATIONS

French Search Report received in Application No. 1355439 mailed Apr. 10, 2014, 10 pages.
Prakash, R. "Nonvolatile SRAM (nvSRAM) Basics," Cypress Perform, Oct. 2013, 9 pages.

* cited by examiner

*Primary Examiner* — Amir Zarabian
*Assistant Examiner* — Muna A Techane
(74) *Attorney, Agent, or Firm* — Slater & Matsil, L.L.P.

(57) ABSTRACT

A memory device includes at least one memory cell having a first SRAM-type elementary memory cell having two inverters coupled to one another crosswise and two groups, each having at least one non-volatile elementary memory cell. The non-volatile elementary memory cells of the two groups are coupled firstly to a supply terminal and secondly to the outputs and to the inputs of the two inverters via a controllable interconnection stage.

26 Claims, 17 Drawing Sheets

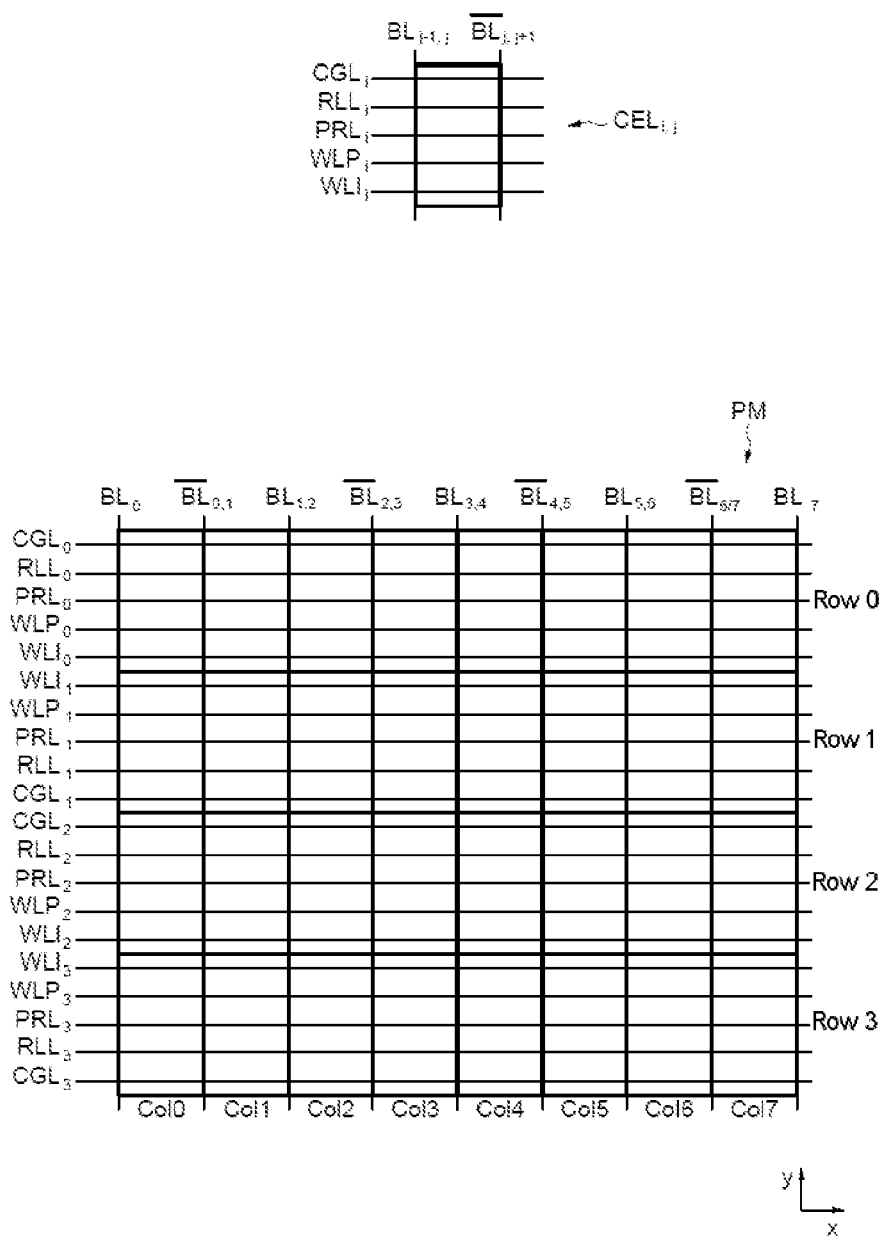

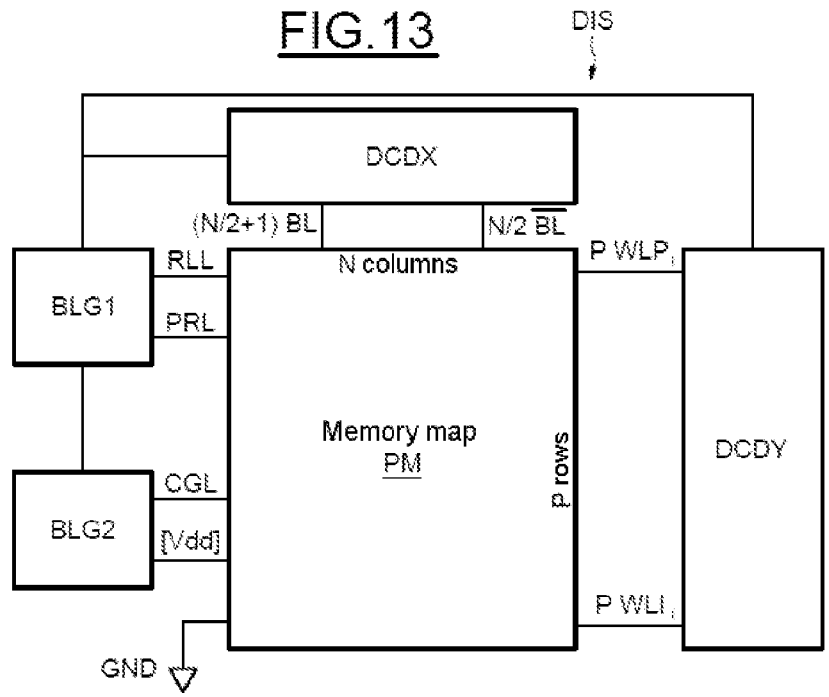
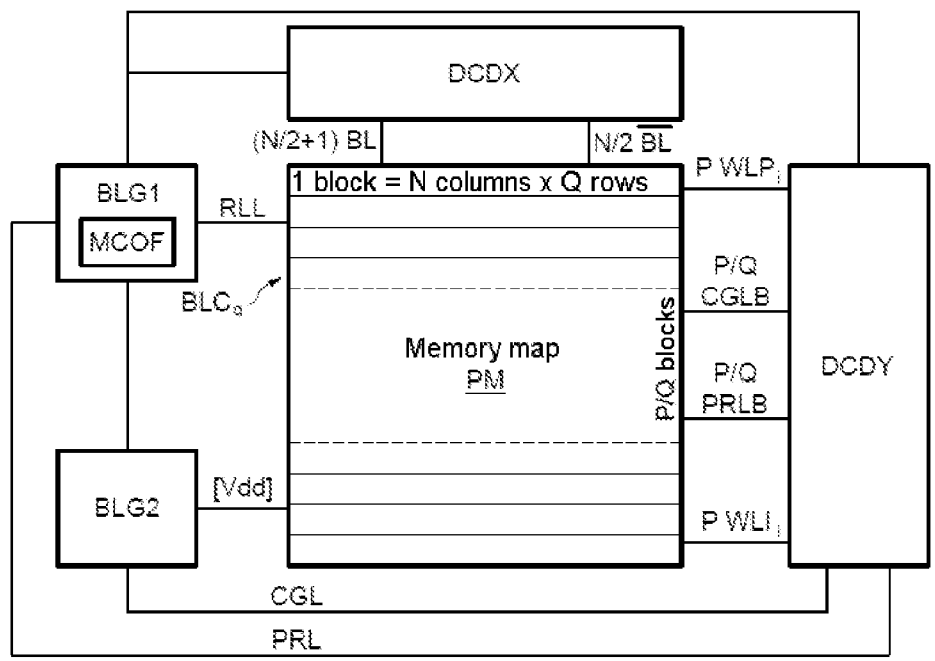

FIG.15
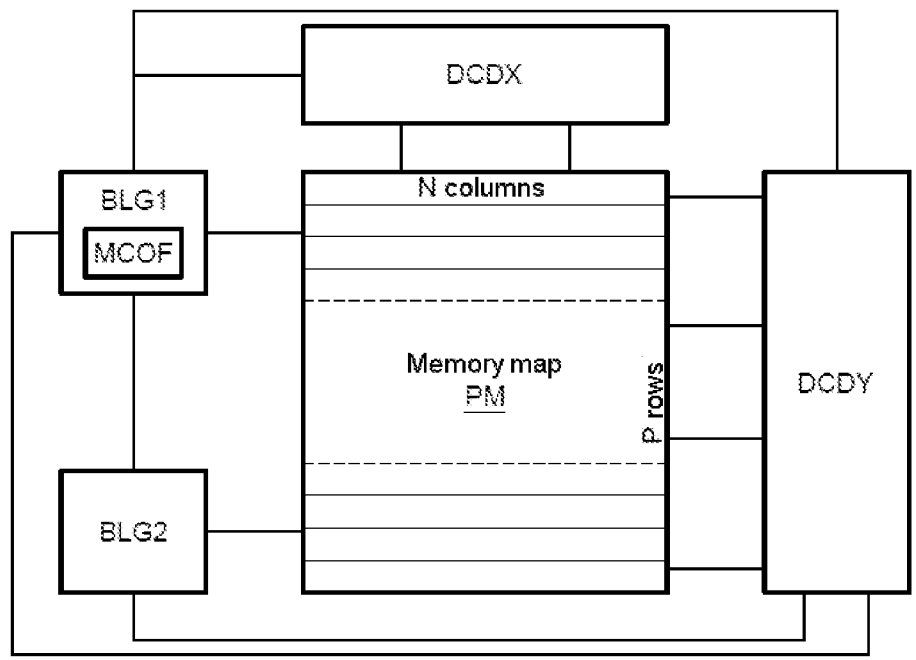
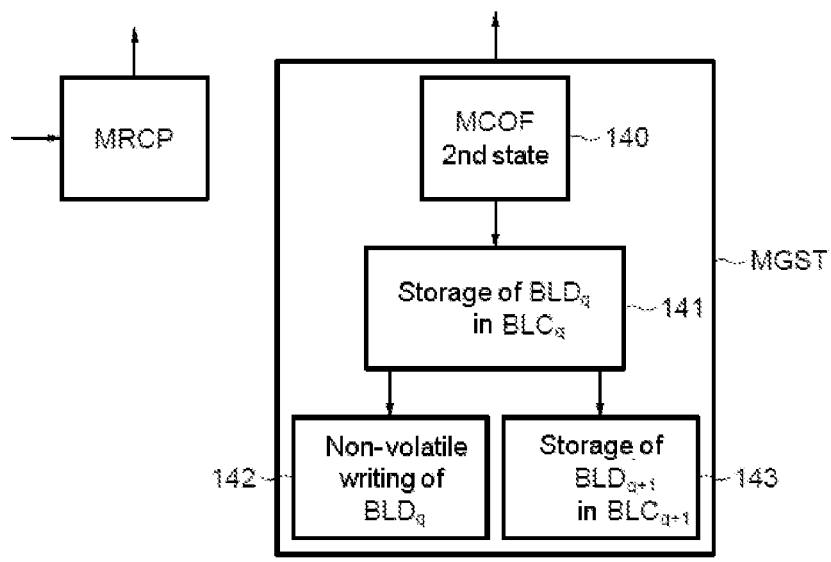

MEMORY DEVICE INCLUDING A SRAM MEMORY PLANE AND A NON VOLATILE MEMORY PLANE, AND OPERATING METHODS

This application claims the benefit of French Application No. 1355439, filed on Jun. 12, 2013, which application is hereby incorporated herein by reference.

TECHNICAL FIELD

The invention relates to memory devices, and more particularly those associating, within one and the same memory cell, an elementary cell of static random access memory (SRAM) type and several non-volatile elementary memory cells, for example two or four, in particular elementary memory cells of electrically erasable and programmable read only memory (EEPROM) type, although it is possible to use non-volatile cells of FLASH type.

BACKGROUND

An elementary memory cell of SRAM type (i.e., an SRAM-type elementary memory cell) is a volatile memory cell, that is to say one that loses its data in the event of a power cut, but that offers a very rapid access speed and infinite cycling.

A non-volatile elementary memory cell, for example a memory cell of EEPROM type, allows the data item to be preserved in the event of a power cut but cannot be cycled indefinitely.

A memory cell associating an elementary cell of SRAM type and several non-volatile cells (for example two or four) allows accumulation of the levels of performance of the two approaches, namely the speed and the infinite reliability of the SRAM memory and the nonvolatility of the non-volatile memory, for example the flash or EEPROM memory.

Under normal operating conditions, a data item is written and read to/from a memory cell of this kind in the elementary cell of SRAM type. On the other hand, notably during a power cut, the content of the elementary SRAM cell is transferred to the non-volatile elementary memory cells that are associated therewith.

Then, notably when power returns, the data contained in the non-volatile memory cells are reloaded into the corresponding SRAM elementary memory cell.

Architectures of such memory cells associating SRAM memory and non-volatile memory are described in the documents U.S. Pat. No. 4,132,904, U.S. Pat. No. 4,467,451, U.S. Pat. No. 4,980,859, U.S. Pat. No. 7,164,608 and U.S. Pat. No. 8,018,768. However, these known structures have numerous drawbacks such as notably a complexity of structure and/or the need to have an SRAM cell supporting a high voltage and/or large constraints for the reloading phase of the SRAM cell.

SUMMARY

One embodiment proposes a novel memory device associating a static memory and non-volatile memories, and offering improved performance levels.

BRIEF DESCRIPTION OF THE DRAWINGS

Other advantages and features of the invention will emerge upon examination of the detailed description of implementations and embodiments, which are in no way limiting, and of the appended drawings, in which:

FIGS. 11 and 12 illustrate examples of a memory map;
FIGS. 13-16 illustrate examples architectures for a memory device.

DETAILED DESCRIPTION OF ILLUSTRATIVE EMBODIMENTS

Figure 1:
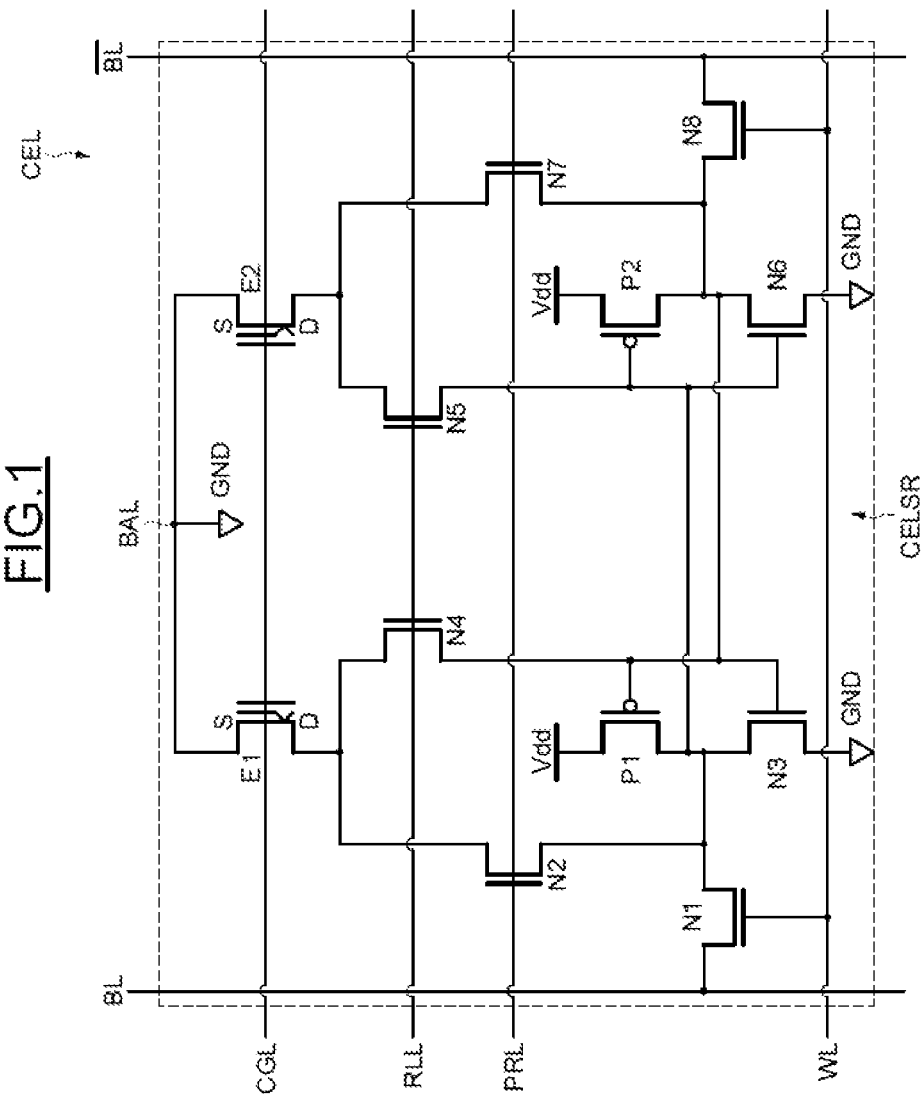
FIG. 1 provides a schematic diagram of a memory cell.

Embodiments of the present invention will be described first followed by further description with respect to the drawings.

One aspect of the invention proposes a memory device comprising at least one memory cell having an elementary memory cell of SRAM type with two inverters coupled to one another crosswise, and two groups, each having at least one non-volatile elementary memory cell possessing a floating-gate transistor.

All floating-gate transistors have their first conduction electrode coupled to a supply terminal and their control electrode coupled to a first control line. The second conduction electrodes of the floating-gate transistors of the non-volatile elementary memory cells of the two groups are respectively coupled at least to the outputs of the two inverters via a controllable interconnection stage. The floating-gate transistors are controllable so as to be all off when a data item stored in the associated elementary memory cell of SRAM type is differentially programmed into the two groups of non-volatile elementary memory cells.

Throughout the text, it is conventionally considered that a write cycle in a non-volatile memory, for example an EEPROM memory or a Flash memory, comprises an erase cycle followed by a programming cycle.

Furthermore, the fact that the floating-gate transistors are all off during differential programming in the non-volatile elementary memory cells makes it possible to avoid shorts between the outputs of the elementary memory cell of SRAM type without using isolation transistors. This thus allows a gain in structural compactness.

Moreover, when the non-volatile elementary memory cells are EEPROM cells, such behavior is distinguished from the programming in a conventional memory cell of EEPROM type in which the floating-gate transistor is on during the programming.

Although not essential, it is particularly advantageous that, during the differential programming, the first control line is intended to receive a first negative control voltage.

Indeed, this allows the use of a low-voltage elementary memory cell of SRAM type because, in this case, the highest voltage is the supply voltage of the elementary cell of SRAM type, typically in the order of a few volts.

The nonuse of a first negative control voltage would have necessitated the use of non-volatile elementary memory cells, for example of EEPROM type, having threshold voltages of a few volts, in combination with an elementary memory cell of SRAM type capable of supporting a high voltage, typically in the order of 15 or so volts.

According to one embodiment, the floating-gate transistors and the interconnection stage are configured so as to selectively confer, at the conclusion of the differential programming, a written state on the at least one non-volatile elementary memory cell of one of the groups, and an erased state on the at least one non-volatile elementary memory cell of the other group.

Thus, the differential programming step or cycle is selective.

More precisely, according to one embodiment, the output of one of the inverters of the elementary memory cell of SRAM type is intended to be in a high logic state, and the output of the other inverter of the elementary cell of SRAM type is intended to be in a low logic state, as a function of the logic value of the data item stored in the elementary cell of SRAM type, and the at least one non-volatile elementary memory cell intended to be in the written state is the one having the floating-gate transistor of which the second conduction electrode is coupled to the output of the inverter intended to be in the high logic state.

On the other hand, the at least one non-volatile elementary memory cell intended to be in the erased state is the one having the floating-gate transistor of which the second control electrode is coupled to the output of the inverter intended to be in the low logic state.

According to one embodiment, during an operation of reloading a data item written differentially to the two groups of associated non-volatile elementary memory cells into the elementary memory cell of SRAM type, the floating-gate transistors are configured so that the floating-gate transistor of the at least one non-volatile elementary memory cell in the written state is on, and that the floating-gate transistor of the at least one non-volatile elementary memory cell in the erased state is off.

When the structure of the interconnection stage is a simplified structure connecting the second conduction electrodes of the floating-gate transistors solely to the outputs of the two inverters, there is no inversion of data during the reloading if the supply terminal is intended to be coupled to the supply voltage. However, this then imposes sizing constraints for the elementary memory cells.

On the other hand, if the supply terminal is grounded, these constraints disappear but data are then inverted during the reloading.

However, this data inversion does not exist during the reloading, even if the supply terminal is intended to be coupled to ground, when the interconnection stage allows connection of the second conduction electrodes of the floating-gate transistors both to the outputs and to the inputs of the inverters of the elementary memory cell of SRAM type.

More precisely, according to one embodiment, the interconnection stage comprises a second control line, a third control line, two first interconnection transistors respectively coupled between the second conduction electrodes of the floating-gate transistors of the non-volatile elementary memory cells of the two groups, and the two outputs of the two inverters of the elementary memory cell of SRAM type. These two first interconnection transistors have their control electrode coupled to the second control line. Two second interconnection transistors are respectively coupled between the second conduction electrodes of the floating-gate transistors of the non-volatile elementary memory cells of the two groups, the two inputs of the two inverters of the elementary memory cell of SRAM type, these second interconnection transistors having their control electrode coupled to the third control line.

Furthermore, in this way, very advantageously, during the differential writing, the second control line is intended to receive a second control voltage turning on the two first interconnection transistors, and the third control line is intended to receive a third control voltage turning off the two second interconnection transistors.

Moreover, during the reloading operation, the second control line is intended to receive a second control voltage turning off the first interconnection transistors and the third control line is intended to receive a third control voltage turning on the two second interconnection transistors.

With such an embodiment, there is no data inversion during the reloading of a data item into the elementary memory cell of SRAM type, even if the supply terminal is coupled to ground.

Another aspect proposes a memory device, comprising at least one memory cell having a first elementary memory cell of SRAM type having two inverters coupled to one another crosswise, two groups, each having at least one non-volatile elementary memory cell, the non-volatile elementary memory cells of the two groups being coupled firstly to a supply terminal, for example intended to be grounded, and secondly to the outputs and to the inputs of the two inverters via a controllable interconnection stage.

As indicated above, the fact that the interconnection stage is coupled both to the inputs and to the outputs of the inverters makes it possible to avoid data inversion during the reloading of the SRAM elementary memory cell with the content of the non-volatile elementary memory cells, even if the supply terminal is grounded.

Moreover, the fact that the supply terminal is intended to be coupled to ground furthermore allows, during the reloading of the content of the non-volatile cells into the SRAM cell, more effective toggling of this elementary memory cell of SRAM type.

According to one embodiment of this aspect, each non-volatile elementary memory cell possesses a floating-gate transistor, all floating-gate transistors having their first conduction electrode coupled to the supply terminal and their control electrode coupled to a first control line. The controllable interconnection stage comprises a second control line and a third control line. Two first interconnection transistors are respectively coupled between the second conduction electrodes of the floating-gate transistors of the non-volatile elementary memory cells of the two groups and the two outputs of the two inverters of the elementary memory cell of SRAM type, and have their control electrode coupled to the second control line. Two second interconnection transistors are respectively coupled between the second conduction electrodes of the floating-gate transistors of the non-volatile elementary memory cells of the two groups and the two inputs of the two inverters of the elementary memory cell of SRAM type, and have their control electrode coupled to the third control line.

Another aspect likewise proposes a method for writing a data item stored in the SRAM elementary memory cell to the two groups of non-volatile elementary memory cells of a memory cell of a device as defined above.

This method comprises an erase cycle for the groups of non-volatile elementary memory cells followed by a differential programming cycle. A control voltage turning on the first interconnection transistors is applied to the second control line and a control voltage turning off the second interconnection transistors is applied to the third control line. A programming voltage, which is advantageously negative, is applied to the first control line so as to turn off all floating-gate transistors. Then the application of the programming voltage is stopped so as to put the at least one non-volatile elementary memory cell of one of the groups into a written state and the at least one non-volatile elementary memory cell of the other group into an erased state.

There is likewise proposed a method for reloading into the elementary memory cell of SRAM type of a memory cell of a device as defined above a data item programmed differentially into the two groups of non-volatile elementary memory cells.

In this method, a control voltage turning off the first interconnection transistors is applied to the second control line and a control voltage turning on the second interconnection transistors is applied to the third control line. A control voltage turns on the floating-gate transistor of the at least one non-volatile elementary memory cell in the written state and turns off the floating-gate transistor of the at least one non-volatile elementary memory cell in the erased state to the first control line.

According to another embodiment, each group comprises a pair of non-volatile elementary memory cells coupled in parallel. The controllable interconnection stage further comprises two first transistors having their conduction electrodes shorted and respectively coupled in series with the two first interconnection transistors. The control electrodes of these two first shorted transistors are coupled to the third control line. Two second transistors likewise have their conduction electrodes shorted and are respectively coupled in series with the two second interconnection transistors while having their control electrode coupled to the second control line.

Such an embodiment allows more compact physical implementation of the device.

Moreover, this embodiment providing a pair of non-volatile elementary memory cells in each group affords improved reliability, because in the event of loss of retention the variation of current for a cell that has become blank again is compensated for by the cell placed in parallel.

According to one embodiment, in which the device comprises a memory map containing several memory cells organized into rows and columns and bit lines and complementary bit lines common to the memory cells of at least some pairs of adjacent columns of cells, two different word lines are associated with each row of cells and the access transistors of the elementary cells of SRAM type of the memory cells are respectively coupled to the corresponding common bit lines and complementary bit lines and the control electrodes of the two pairs of access transistors of two adjacent cells of SRAM type are respectively coupled to the two different word lines.

Such an embodiment allows a gain in space for the placement diagram ("layout") and amounts to interlacing two logical word lines over a single physical row.

According to another embodiment, each memory cell furthermore comprises an isolation stage having a fourth control line and an isolation transistor coupled between the first conduction electrode of each floating-gate transistor and the supply terminal, the control electrodes of all isolation transistors being coupled to the fourth control line.

Such an embodiment renders the erasure cycle selective.

There is likewise proposed a method in which the erasure cycle comprises the application of the following voltages. A control voltage turns on the first interconnection transistors to the second control line and another control voltage turns off the second interconnection transistors to the third control line. A control voltage turns off the isolation transistors to the fourth control line. An erasure voltage turns on the floating-gate transistors to the first control line.

There is also proposed a reloading method. A control voltage is applied to turn off the first interconnection transistors to the second control line. A control voltage is applied to turn on the second interconnection transistors to the third control line. A control voltage is applied to turn on the isolation transistors to the fourth control line. A control voltage is applied to turn on the floating-gate transistor of the at least one non-volatile elementary memory cell in the written state and turn off the floating-gate transistor of the at least one non-volatile elementary memory cell in the erased state to the first control line.

According to another embodiment, in which the device comprises a memory map containing several memory cells organized into blocks of cells, there is likewise provision for controllable configuration circuit having a first state, in which they are capable of putting all memory cells of the memory map either into a read or write mode of SRAM type or into a write mode for the groups of non-volatile elementary memory cells. The configuration circuit also has a second state, in which they are capable of selectively putting, on a block-by-block basis, all memory cells of a block either into a read or write mode of SRAM type or into a write mode for the groups of non-volatile elementary memory cells.

Such an embodiment makes it a simple matter to implement the memory device in a chip capable of operating in wired mode or in contactless mode, for example in technology of NFC (Near Field Communication) type.

Indeed, in a wired mode, that is to say when the memory device receives data via a bus typically having a high speed, for example a bus $I^2C$ with a speed of 1 Mb/second or a bus of SPI type with a speed of greater than 1 Mb/second, it is particularly advantageous for the non-volatile write speed to be the highest possible, or even higher than the speed of the bus. Moreover, during a power cut, it is advantageous to be able to write a maximum of data to the non-volatile elementary memory cells, for example the whole SRAM memory map, in a single pass. The high power available in wired mode affords this possibility.

On the other hand, in contactless mode, the available power is low, hence the need to reduce consumption for non-volatile writing to the memory device. Furthermore, in such a contactless mode, the bus has a low speed, for example a speed of 106 kb/second when communication takes place in accordance with the ISO 14 443 type B protocol. It is therefore particularly advantageous to be able to write by successive blocks. Indeed, the maximum non-volatile write speed of the memory device is thus divided by the number of blocks and the consumption during non-volatile writing is greatly reduced because, in the first order, it is practically divided by the number of blocks.

Thus, according to another embodiment, the device furthermore comprises a reception circuit configured to receive successive blocks of data and a management circuit configured to put the configuration circuit into its second state, to store a current block of data in the elementary memory cells of SRAM type of the memory cells of a block of memory cells, then to carry out a non-volatile write cycle for the data thus written to the SRAM cells, in the non-volatile elementary memory cells of the memory cells of the block of cells and, at the same time as the non-volatile writing, to store the support block of data in the elementary memory cells of SRAM type of the memory cells of another block of memory cells.

In other words, it becomes possible to load SRAM data into a portion of the memory map while another sector of the memory map is undergoing non-volatile writing.

Furthermore, when the memory map contains several memory cells organized into rows and columns, each block of memory cells has several rows of memory cells, for example.

Generally, during a power cut, the whole content of the SRAM memory is transferred to the non-volatile memory in a single write cycle. Furthermore, upon power-up, the content of the non-volatile elementary memory cells is reloaded into the SRAM elementary memory cells.

Furthermore, in this respect, the whole memory map is generally supplied with power upon power-up, which necessitates putting all cells into a known reinitialized state and, at the same time or subsequently, reloading the non-volatile data into the associated SRAM elementary cells.

However, these two steps are both consumers of current, which presents a problem in the case of a chip incorporating such a memory device and having to operate under low consumption, for example self-powered radio-frequency or NFC chips. Indeed, in the latter case, since the energy budget is limited, the current surge necessary for executing these two steps thus risks causing a fall in supply voltage and stoppage of the chip then restarting of the chip followed again by stoppage, and so on.

Therefore, according to one embodiment, provision is made for control means configured so as, during power-up of the device, for example following a power supply drop, not to supply power to the memory map and to authorize the supply of power to a set of at least one memory cell and the reloading of the elementary memory cell of SRAM type of the at least one memory cell with the content of the associated non-volatile elementary memory cells, only during the addressing of the elementary memory cell of SRAM type.

Thus, according to this embodiment, the memory map is not supplied with power upon power-up and will be supplied with power progressively by subportions according to need. Although it is possible to supply power to the memory map on a cell-by-cell basis, it is generally easier to provide a set having several memory cells and to authorize the supply of power to the set and the reloading of all the elementary memory cells of SRAM type in this set with the content of the corresponding non-volatile elementary memory cells only when at least one elementary cell of SRAM type in the set is addressed.

In general, the memory map contains several memory cells organized into rows and columns, and the set of memory cells may have at least one row of memory cells, and generally several rows, for example two.

Another aspect proposes an integrated circuit, for example incorporated into a contactless chip, comprising a memory device as defined above.

Reference is now made to FIG. 1. In this figure, the reference CEL denotes a memory cell having an elementary memory cell of SRAM type CELSR and two non-volatile elementary cells of EEPROM type, in this case having two floating-gate transistors E1 and E2.

The non-volatile EEPROM cells of the cell CEL are conventional cells, that is to say in which the selection transistor has been removed and having a tunnel injection region between floating gate and drain.

The sources of these two transistors E1 and E2 are coupled to a supply terminal BAL, which in this case is grounded.

The control electrodes of the two floating-gate transistors E1 and E2 are themselves recoupled to a first control line CGL.

The elementary cell CELSR is of conventional structure and comprises a first inverter having the PMOS transistor P1 and the NMOS transistor N3, and a second inverter having the PMOS transistor P2 and the NMOS transistor N6. These two inverters are coupled between another supply terminal that is intended to be coupled to the supply voltage Vdd and ground.

These two inverters are coupled to one another crosswise, that is to say that the input of the first inverter, formed by the gates of the transistors P1 and N3, is coupled to the output of the second inverter, formed by the drains of the transistors N6 and P2, while the input of the second inverter, formed by the gates of the transistors P2 and N6, is coupled to the output of the first inverter, formed by the drains of the transistors P1 and N3.

The cell CELSR likewise has two NMOS access transistors, referenced N1 and N8, that are respectively coupled between the outputs of the two inverters and two bit lines BL and $\overline{BL}$, $\overline{BL}$, denoting the complementary bit line for the line BL.

The gates of the access transistors N1 and N8 are coupled to a word line WL.

The drains of the two floating-gate transistors E1 and E2 are coupled to the inputs and to the outputs of the two inverters by an interconnection stage in this case having two first NMOS interconnection transistors, referenced N2 and N7, and two second NMOS interconnection transistors, referenced N4 and N5.

More precisely, the two first interconnection transistors N2 and N7 are respectively coupled between the drains of the two floating-gate transistors E1 and E2 and the two outputs of the two inverters P1, N3 and P2, N6. Moreover, the control electrodes (gates) of these two interconnection transistors N2 and N7 are coupled to a second control line PRL.

The two second interconnection transistors N4 and N5 are themselves respectively coupled between the drains of the two floating-gate transistors E1 and E2 and the two inputs of two inverters P1, N3 and P2, N6.

The control electrodes of these two second interconnection transistors N4 and N5 are coupled to a third control line RLL.

Although the two second interconnection transistors N4 and N5 are not indispensable, they are particularly advantageous because they allow—as will be seen in more detail below—the avoidance of data inversion when reloading the content of the two non-volatile cells E1 and E2 to the SRAM elementary memory cell CELSR, even with an grounded supply terminal BAL.

Figure 2:
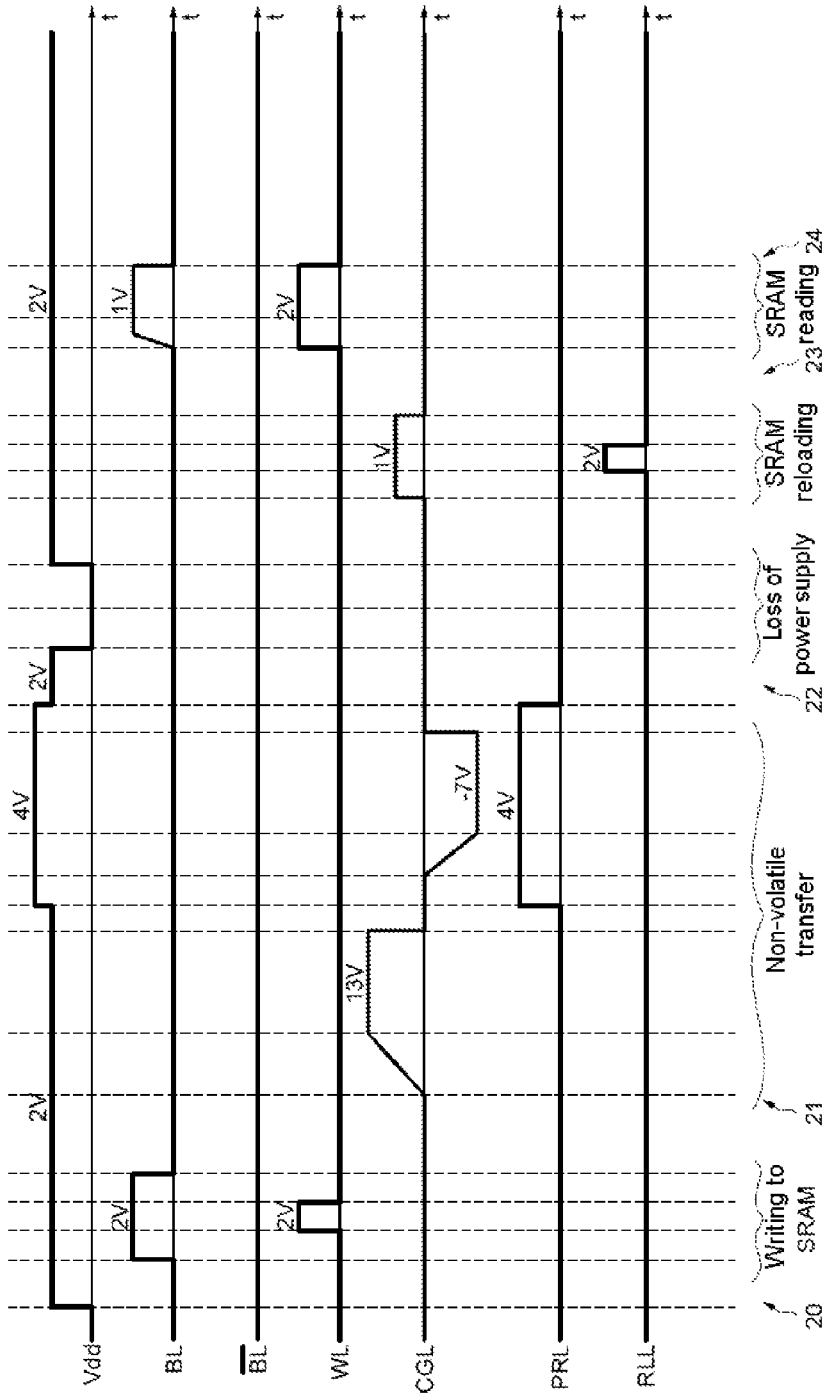
FIG. 2 is a timing diagram illustrating various modes of operation of the memory cell of FIG. 1.

Reference will now be made more particularly to FIG. 2, which is a timing diagram illustrating various modes of operation of the memory cell CEL of FIG. 1.

The writing to the elementary memory cell CELSR, referenced 20 in FIG. 2, is conventional writing.

More precisely, to write a "1", the bit line BL is brought to the supply voltage Vdd (in this case two volts), while the complementary bit line $\overline{BL}$, is at ground and the word line WL is brought to the supply voltage Vdd.

The control lines PRL, RLL are at ground, turning off the interconnection stage. Equally, the first control line CGL is likewise at ground.

The drain of the transistor N6 and the gates of the transistors P1 and N3 are pulled to ground via the transistor N8, which is on. The latch formed by the two crossed inverters is thus toggled by virtue of the drain of the transistor N3 changing to Vdd and the drain of the transistor N6 changing to ground.

When the cell is selected to write a "0" to the elementary cell CELSR, the bit line BL is at ground, the complementary bit line $\overline{BL}$ is at the supply voltage Vdd and the word line is likewise at the supply voltage Vdd.

The drain of the transistor N3 and the gate of the transistors P2 and N6 are pulled to ground by the transistor N1, which is on. The latch is toggled via the drain of the transistor N3, which changes to ground, and the drain of the transistor N6, which changes to Vdd.

The data item is held when the cell is deselected.

The reading of a data item from the cell CELSR is likewise conventional reading and is illustrated by the reference 24 in FIG. 2.

The read access to the cell is effected by the bit line BL and the complementary bit line $\overline{BL}$, the word line "WL" being brought to the supply voltage Vdd. One of the two bit lines is pulled to ground, the other being at the voltage Vdd minus the threshold voltage of an NMOS transistor. The different states of the bit lines are sent to conventional read circuitry so as to determine the logic value of the data item that has been read.

Non-volatile transfer or storage 21 of the content of the cell CELSR to the two non-volatile elementary memory cells E1 and E2 will now be described.

In this respect, it is supposed that the cell CELSR is positioned in order to store a "1", for example, that is to say that the source of the transistor N2 is at the supply voltage Vdd while the source of the transistor N7 is at ground.

The word line WL is likewise at ground.

Of course, all that follows will need to be inverted if the SRAM cell is positioned in order to store a "0".

Non-volatile transfer or writing is made up of an erase cycle followed by a differential programming cycle, since two non-volatile elementary memory cells are present.

For the erase cycle, the lines PRL and PLL are held at ground, turning off the interconnection transistors N2, N4, N5 and N7. Next, an erase voltage is sent on the first control line CGL. In the example described here, this erase voltage has a ramp then a plateau having a typical amplitude of 13 volts. The rise of the ramp can be typically effected in approximately 0.5 millisecond, while the typical duration of the plateau is 1 millisecond.

By means of coupling to the first control line CGL, the floating gates of the transistors E1 and E2 rise to approximately 9 volts, turning on the non-volatile cells and forcing the drain region to 0 volt.

The tunnel current discharges the floating gates of E1 and E2 to the drain region. Once the voltage on the first control line CGL has returned to rest (0 volt), there is a negative charge of approximately −1.5 volts on the floating gates of E1 and E2.

The two cells E1 and E2 are then erased.

The differential programming cycle is then effected as follows.

The second control line PRL changes to the supply voltage Vdd, which in this case has changed to 4 volts, while the third control line RLL remains at ground.

Therefore, the interconnection transistors N2 and N7 are on while the interconnection transistors N4 and N5 are off.

A programming voltage is then sent on the first control line CGL.

This programming voltage is a negative voltage formed by a ramp then a plateau of typical amplitude −7 volts. There again, the duration of the ramp is typically 0.5 millisecond while the duration of the plateau is typically 1 millisecond.

The floating-gate transistors E1 and E2 are off, which makes it possible to avoid a short to the grounded supply terminal BAL, without use of additional isolation transistors, which would be coupled between the sources of the transistors E1 and E2 and the supply terminal BAL.

The transistor N2, which is on, transfers a voltage equal to Vdd minus the threshold voltage of the NMOS transistor to the drain of the transistor E1. The transistor N7, which is on, transmits a voltage of 0 volt to the drain of the transistor E2.

The floating gate of the transistor E1, previously discharged to −1.5 volts, will fall to −6.5 volts through capacitive coupling. The potential difference through the injection region of the transistor E1 is typically 9.5 volts. Therefore, the floating gate of the transistor E1 will be charged positively by tunnel effect.

The floating gate of the transistor E2, previously discharged to −1.5 volts, will fall to −7.5 volts through capacitive coupling. The potential difference through the injection region of the transistor E1, typically in the order of 7.5 volts, is insufficient to charge the floating gate of E1 by tunnel effect.

Once the voltage of the first control line CGL has returned to rest, that is to say at the conclusion of the differential programming, the positive charge of 1.5 volts on the floating gate of E1 turns on this cell and puts it into the written state, while the negative charge of −1.5 volts on the floating gate of E2 turns off this cell, that is to say puts it into the erased state.

It is thus noted here that the erasure of the non-volatile cells is unconditional erasure, while the programming is selective according to the value of the data item contained in the SRAM cell CELSR, that is to say according to the drain voltage of the non-volatile cell.

It is then supposed that a loss of power 22 occurs, followed by power-up again. Therefore, the reloading of the non-volatile data (that is to say the data contained in the non-volatile cells E1 and E2) into the SRAM cell CELSR will now be described.

For this reloading, the first control line CGL changes to a reference read voltage, typically 1 volt, while the second control line PRL is at ground and the third control line RLL is at a voltage of 2 volts, for example, so as to turn on the transistors N4 and N5 while the transistors N2 and N7 are off.

The voltage of the word line WL is zero.

The non-volatile cell E1, which is on, pulls the drain of the transistor N6 and the gates of the transistors P1 and N3 to ground.

The cell E2 is itself off.

Therefore, the cell CELSR changes to the state 1, storing the logic "1" again.

It is thus noted in this case that although the supply terminal BAL is at ground, there is no data inversion when the cell CELSR is reloaded with the content of the non-volatile cells E1 and E2.

It will likewise be noted in this case that the "disturb" is limited (the "disturb" is a very slow change of state for the cell when it is read, whereas any change of state can take place only while the cell is being written to) by limiting the voltage on the third control line RLL, with the transistors N4 and N5 acting as a cascode. Indeed, by limiting the voltage on the line RLL to 2 volts, for example, the drain voltage of the transistors E1 and E2 cannot exceed approximately 1 volt, protecting against parasitic programming of E1 or E2.

Figure 3:
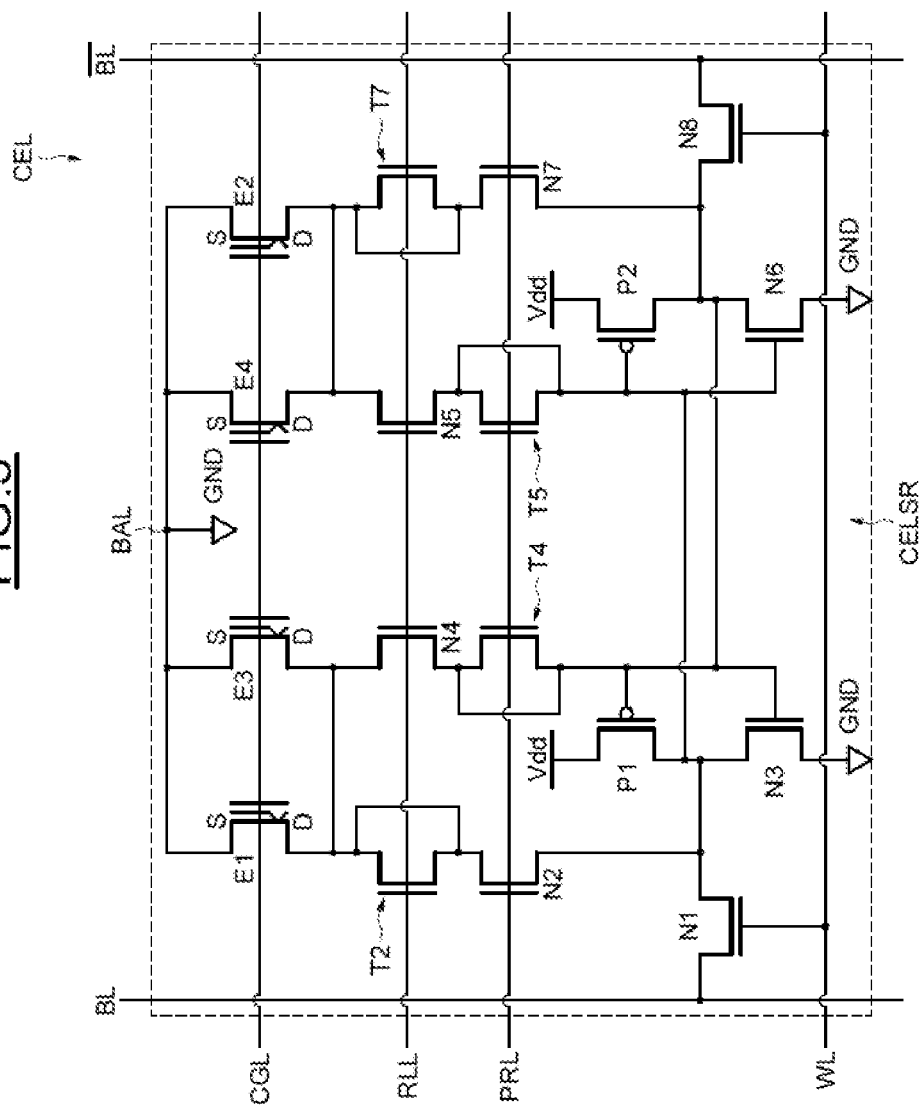
FIGS. 3-9 provide schematic diagrams of other embodiment memory cells.

The embodiment of the cell CEL in FIG. 3 differs from that in FIG. 1 in that the two groups of the cell CEL each have a pair of non-volatile elementary memory cells coupled in parallel.

More precisely, a first pair comprises the floating-gate transistors E1 and E3 and a second pair comprises the floating-gate transistors E2 and E4. The sources of the transistors E1 and E3 are coupled together to the supply terminal BAL, and the sources of the transistors E2 and E4 are coupled together to the supply terminal BAL.

The drains of the transistors E1 and E3 are coupled together and the drains of the transistors E2 and E4 are coupled together.

Moreover, the interconnection stage in this case furthermore comprises two first transistors T2 and T7 having their conduction electrodes (source and drain) shorted.

The transistor T2 is coupled in series between the drains of the floating-gate transistors E1 and E3 and the first interconnection transistor N2.

Equally, the first transistor T7 has its conduction electrodes shorted and is coupled in series between the drains of the transistors E2 and E4 and the other first interconnection transistor N7. The gates of the transistors T2 and T7 are coupled to the third control line RLL.

The interconnection stage likewise has two second transistors T4 and T5 likewise having their conduction electrodes shorted. The second transistor T4 is coupled in series with the second interconnection transistor N4, and the second transistor T5 is coupled in series with the other second interconnection transistor N5.

The command electrodes of the transistors T4 and T5 are coupled to the second control line PRL.

Such an embodiment affords better stability for the cell CEL. Indeed, in the event of loss of retention, the variation in current of a non-volatile elementary memory cell that has become blank again is compensated for by the non-volatile elementary memory cell that is coupled in parallel therewith.

Moreover, the fact that shorted transistors obtained from an established region that is normally used in a conventional EEPROM cell are placed beneath the crossings of the second and third control lines RLL and PRL allows a more compact physical implementation of the cell.

Figure 4:
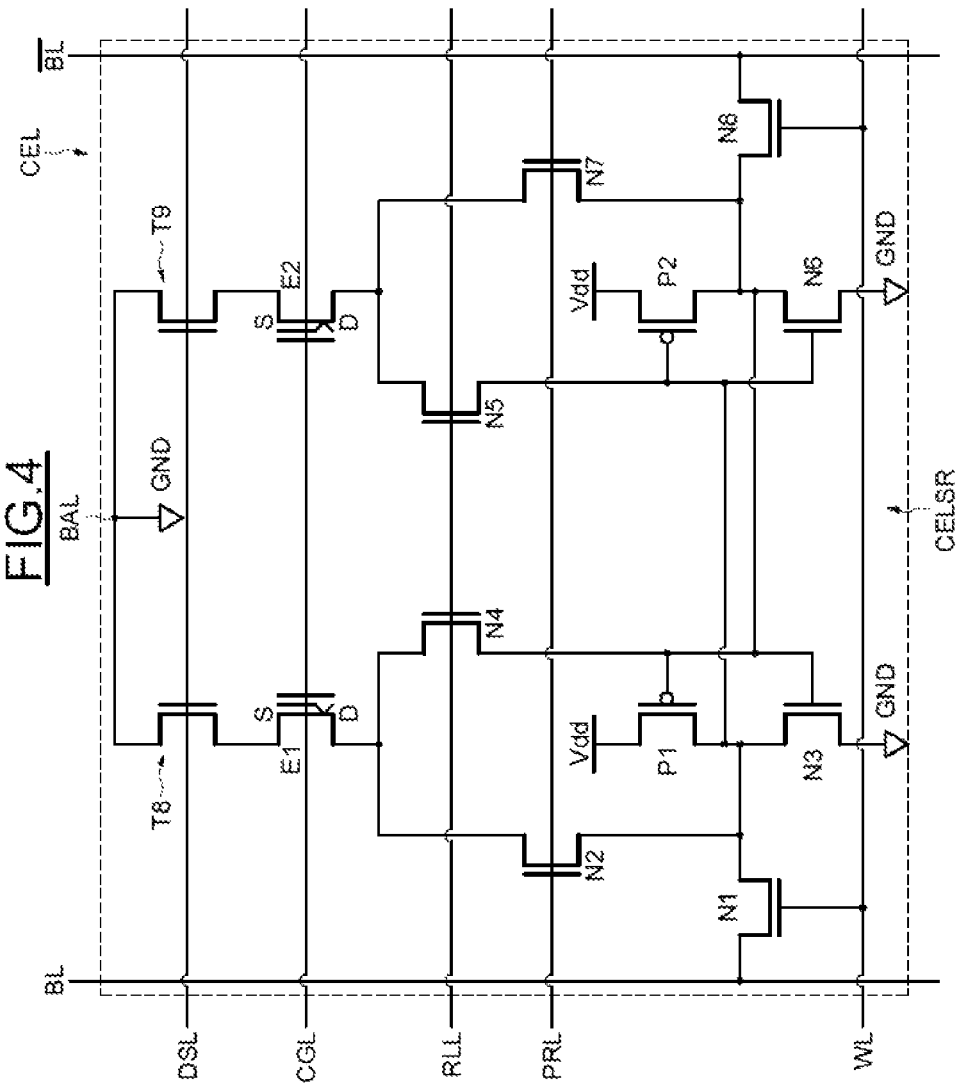

In relation to the embodiment of FIG. 1, the cell CEL in FIG. 4 furthermore has an isolation stage having a fourth control line DSL and two NMOS isolation transistors T8 and T9.

The isolation transistor T8 is coupled between the source of the floating-gate transistor E1 and the supply terminal BAL.

The isolation transistor T9 is coupled between the source of the floating-gate transistor E2 and the supply terminal BAL.

The control electrodes of the two isolation transistors T8 and T9 are coupled to the fourth control line DSL.

This embodiment, which is less compact than the one in FIG. 1, allows the step of erasing the cell to be selective, the selectivity of the write step being preserved.

More precisely, during the erase cycle, the second control line PRL is positioned at Vdd, turning on the interconnection transistors N2 and N7. The third control line RLL is positioned at 0 volt, turning off the interconnection transistors N4 and N5.

A voltage of 0 volt is applied to the fourth control line DSL, turning off the isolation transistors T8 and T9.

Furthermore, an erase voltage turning on the floating-gate transistors E1 and E2 is applied to the first control line CGL.

Thus, a voltage of approximately 3 volts is typically transmitted to one of the cells E1 and E2. This voltage of 3 volts inhibits the erasure on the branch in which the writing will be performed. The fourth control line DSL avoids returns of current from the drains of the non-volatile cells E1 and E2 to the ground line (supply terminal BAL coupled to ground) during erasure.

When the SRAM cell CELSR is reloaded, a control voltage, for example ground, turning off the interconnection transistors N2 and N7 is applied to the second control line PRL.

A control voltage turning on the interconnection transistors N4 and N5 is applied to the third control line RLL.

A control voltage turning on the isolation transistors T8 and T9 is likewise applied to the fourth control line DSL.

Furthermore, a control voltage turning on the floating-gate transistor of the non-volatile elementary memory cell in the written state and turning off the floating-gate transistor of the non-volatile memory cell in the erased state is applied to the first control line CGL.

Such an embodiment (FIG. 4) greatly improves endurance, since the non-volatile rewriting of a data item that is identical to the previous data item consists in reconfirming the non-volatile data items without cycling them (the written cell will not be erased and will be reprogrammed, while the erased cell will be re-erased but not reprogrammed).

This therefore makes it possible not to pointlessly use the non-volatile cells in the case of a partial change of the data in the SRAM cell CELSR.

Figure 5:
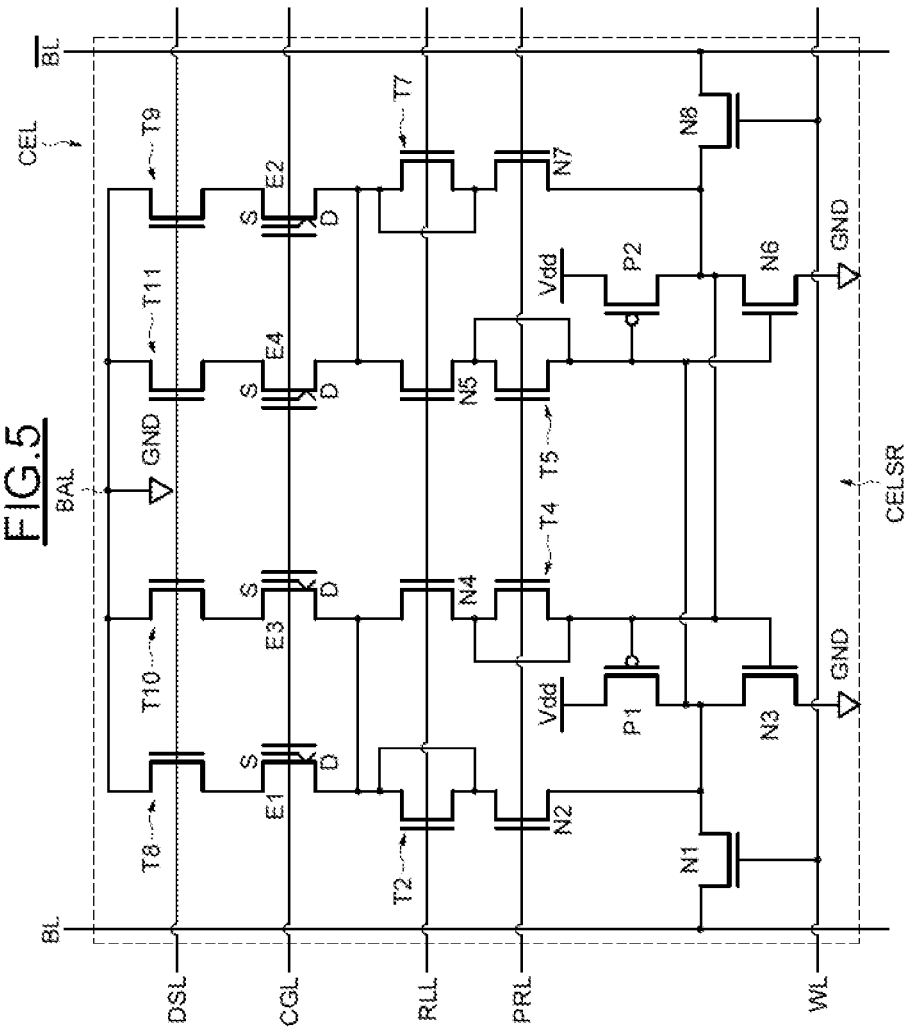

The embodiment in FIG. 5 is a combination of the embodiments in FIGS. 3 and 4.

More precisely, two groups, each containing a pair of non-volatile elementary memory cells coupled in parallel, in combination with shorted transistors, are found in this embodiment in FIG. 5.

Moreover, in this embodiment, the isolation stage has a first pair of isolation transistors T8 and T10 respectively coupled between the pair of floating-gate transistors E1 and E3, and also a pair of isolation transistors T9, T11 respectively coupled between the pair of floating-gate transistors E2, E4 and the supply terminal BAL.

The operation of this cell, notably for erasure and for reloading, is identical to that described in reference to FIG. 4.

Figure 6:
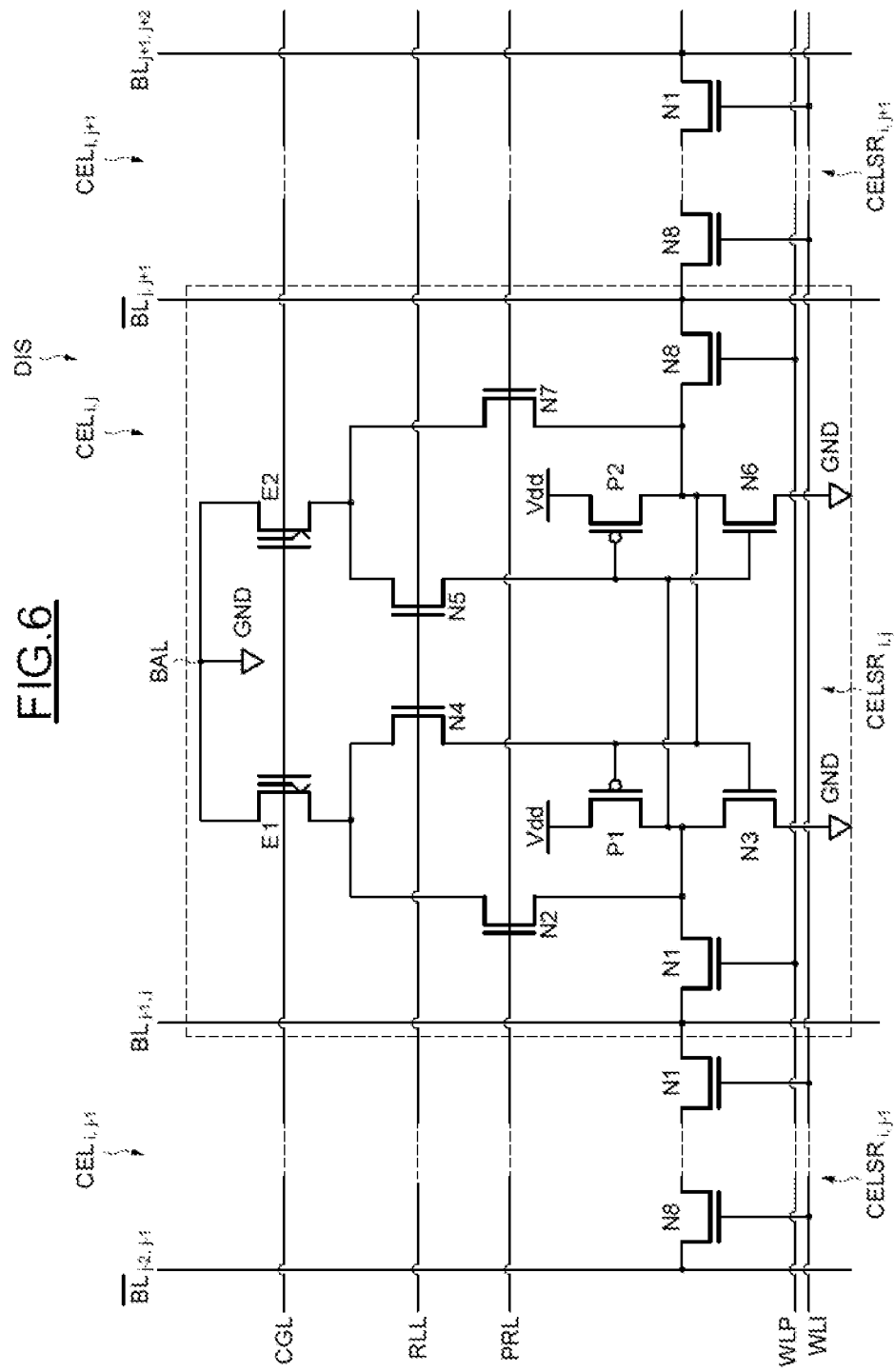

In the embodiment in FIG. 6, the memory device DIS comprises a memory map comprising several memory cells $CEL_{i,j}$ organized into rows and columns.

There is provision for bit lines that are common to the memory cells of two adjacent columns of cells.

Thus, the bit line $BL_{j-1,j}$ is common to the cells $CEL_{i,j-1}$, and $CEL_{i,j}$ belonging to the same row i and to the two adjacent columns j−1 and j. Equally, the complementary bit line $\overline{BL}_{j,j+1}$ is common to the cells $CEL_{i,j}$ and $CEL_{i,j+1}$.

There is likewise provision for two different word lines WLP and WLI associated with each row i of cells.

The two access transistors N1 and N8 of the elementary cell of SRAM type $CELSR_{i,j}$ are respectively coupled to the corresponding common bit line and complementary bit line $BL_{j-1,j}$ and $\overline{BL}_{j,j+1}$.

The control electrodes of the two pairs of access transistors N1, N8 of the two adjacent elementary SRAM cells $CELSR_{i,j}$ and $CELSR_{i,j+1}$ are respectively coupled to two different word lines, namely alternately to the lines WLP and WLI.

Such an embodiment allows space gain for the placement diagram ("layout"), since notably the source contact of the transistor N1 and the source contact of the transistor N8 are shared with the adjacent cell.

The cells are mirrored for X.

This embodiment requires—as indicated above—two word lines WLP, WLI to allow the bit line voltage to be directed to just one of the two adjacent cells.

This thus involves interlacing two logic word lines over a single physical row.

The sharing of the bit lines between two adjacent cells and the use of two word lines WLP and WLI applies whatever the embodiment of the memory cell CEL.

Figure 7:
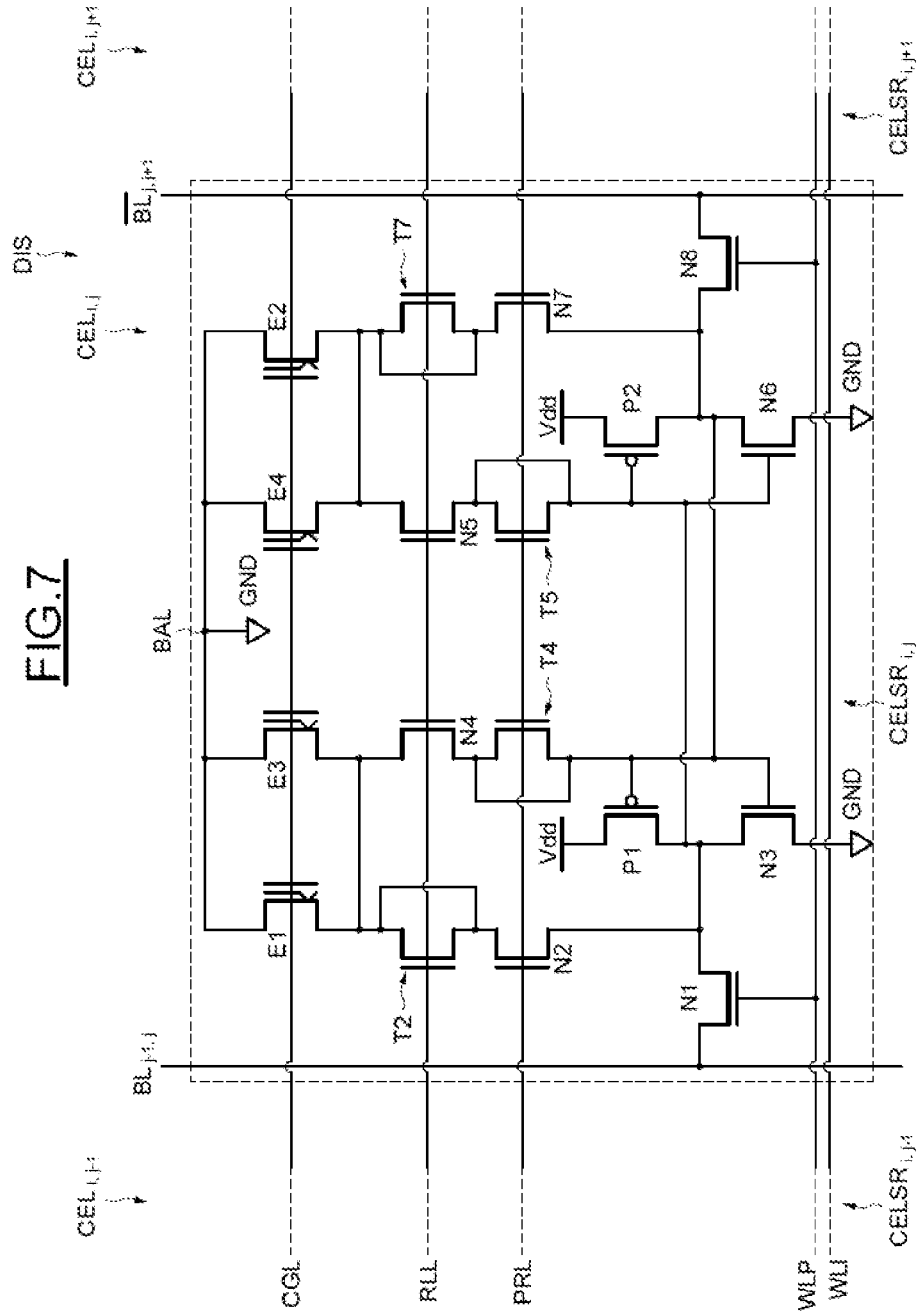
Figure 8:
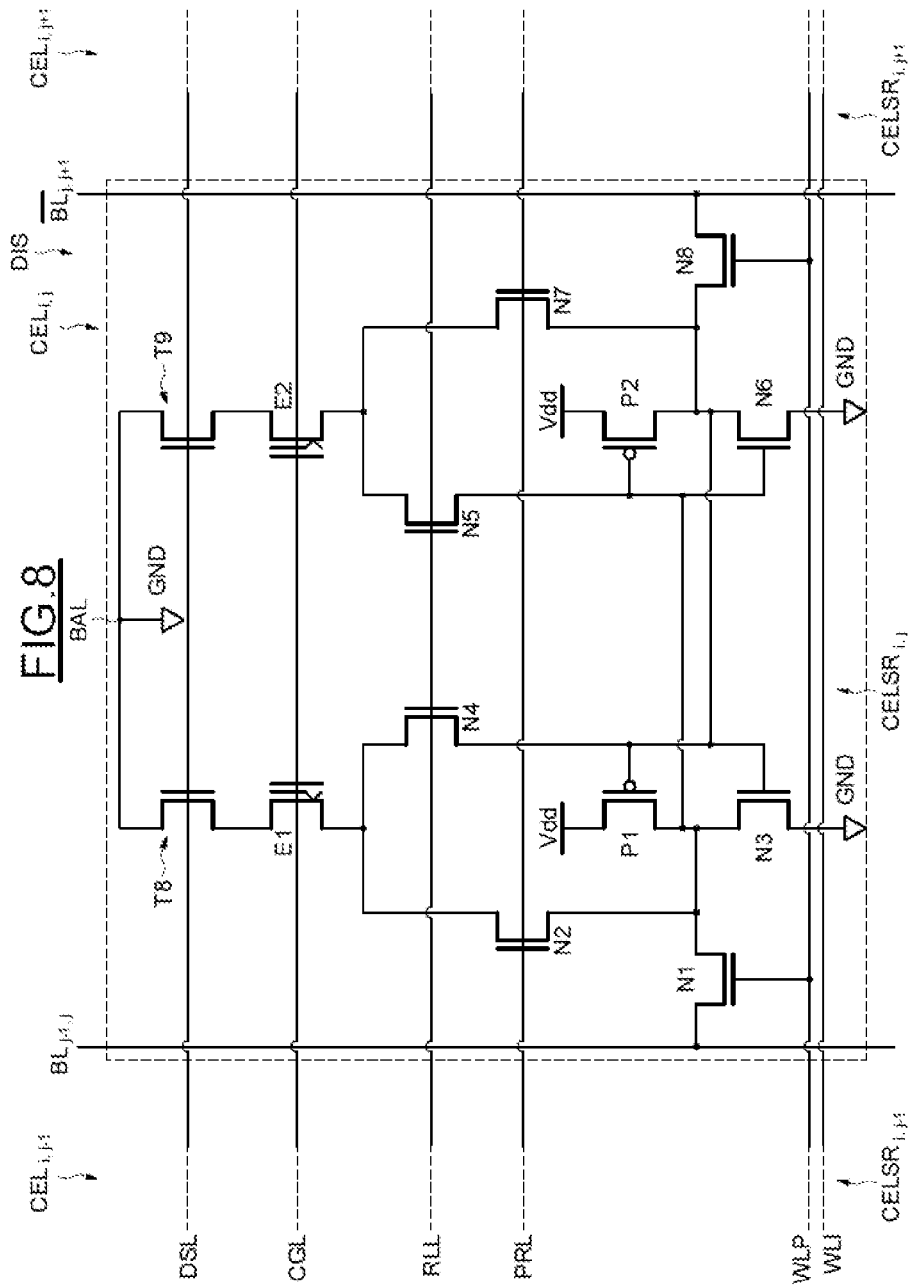
Figure 9:
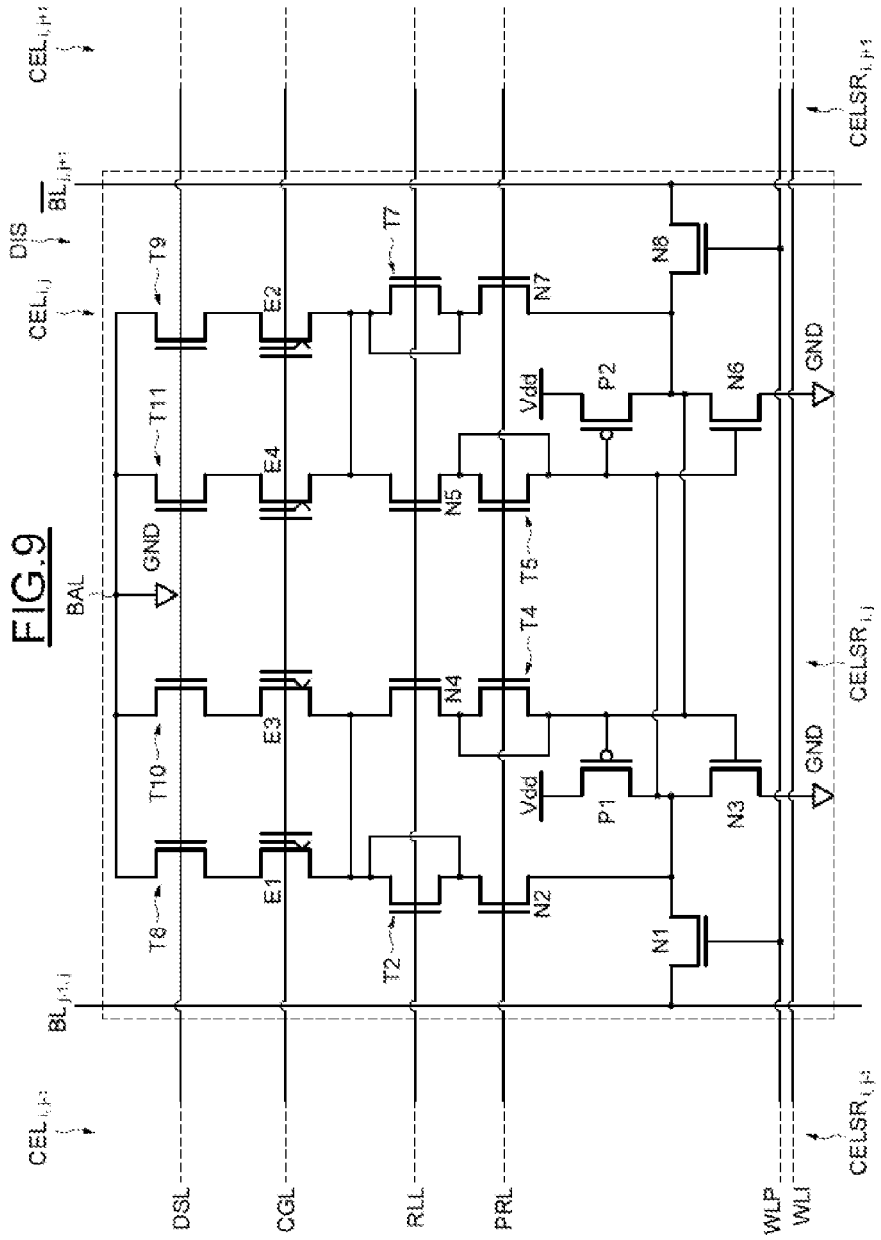

Thus, whereas in FIG. 6 the cell $CEL_{i,j}$ was compliant with the embodiment of FIG. 1, it is:
 in FIG. 7 compliant with the embodiment of FIG. 3,
 in FIG. 8 compliant with the embodiment of FIG. 4, and
 in FIG. 9 compliant with the embodiment of FIG. 5.

Figure 10:
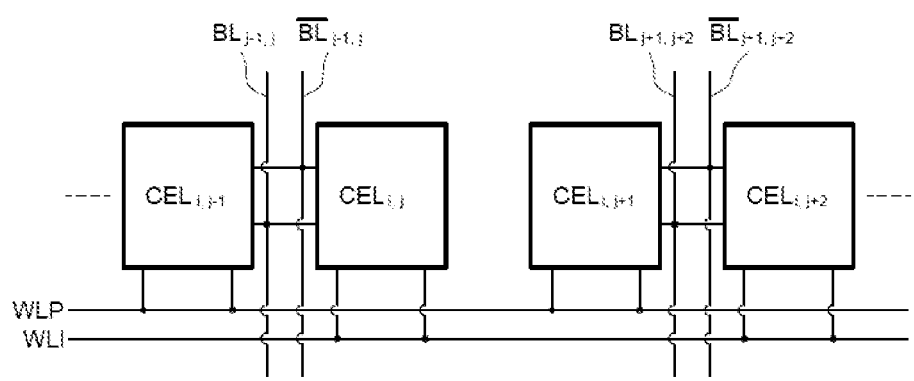
FIG. 10 illustrates a number of memory cells coupled together.

Another way of sharing the bit lines and complementary bit lines is illustrated schematically in FIG. 10.

In this figure, the cells ($CEL_{i,j-1}$, $CEL_{i,j}$; $CEL_{i,j+1}$, $CEL_{i,j+2}$) of two adjacent columns share both the same bit line and the same complementary bit line (the transistors N1 of these cells are coupled to the same common bit line and the transistors N8 are coupled to the same common complementary bit line). By contrast, the cells $CEL_{i,j}$, $CEL_{i,j+1}$ of two adjacent columns respectively belonging to two different pairs of adjacent columns share neither a bit line nor a complementary bit line.

Of course, there again, the control electrodes of the two pairs of access transistors N1, N8 of the two adjacent elementary SRAM cells $CELSR_{i,j}$, and $CELSR_{i,j+1}$ are respectively coupled to two different word lines, namely alternately to the lines WLP and WLI.

Moreover, in FIG. 10, each cell may be compliant with one of the embodiments illustrated in FIGS. 1, 3, 4 and 5.

FIG. 12 illustrates an example of a memory map PM having P rows (P=4) and N columns (N=8) of cells $CEL_{i,j}$ schematically represented by a rectangle.

As illustrated in FIG. 11 notably, each memory cell $CEL_{i,j}$, which in this example is a cell of the type illustrated in FIG. 7, has metallizations (or control lines) $CGL_i$, $RLL_i$, $PRL_i$, $WLP_i$, $WLI_i$. Metallizations transporting the supply voltage Vdd and ground GND are likewise present on these cells $CEL_{i,j}$ but are not shown here in order to simplify the drawings.

It can be seen in FIG. 11 that the adjacent cells are mirrored for X and mirrored for Y. The memory map is a memory map of P times N bits (in this case 32 bits).

There are therefore N/2+1 bit lines BL and N/2 complementary bit lines $\overline{BL}$.

Equally, for P rows, there are P lines $WLP_i$ and P lines $WLI_i$.

FIG. 13 provides a more precise illustration of an example of architecture for the device DIS having a memory map of N columns and P rows. The lines $RLL_i$ are all coupled together to form a single line RLL coupled to a module BLG1 having a control logic unit. Equally, the lines $PRL_i$ are all coupled to form a single line PRL that is likewise coupled to the module BLG1. This module BLG1 may be formed by logic circuits.

Equally, the lines $CGL_i$ are all coupled together to form a single line CGL coupled to a second module BLG2. The metallizations Vdd are likewise coupled together to form a single metallization Vdd coupled to the module BLG2. Equally, all the grounded metallizations are coupled together.

The module BLG2 notably has a positive/negative charge pump, a programming ramp generator, a programming sequencer, and a pump in order to generate the voltage Vdd that is necessary for the non-volatile transfer when the overall voltage Vdd of the circuit is too low.

The P word lines $WLP_i$ and the P word lines $WLI_i$ are coupled to a row decoder DCDY and the bit lines and the complementary bit lines are coupled to a column decoder and to latches and read amplifiers, all these elements being globally referenced by the reference DCDX.

The embodiment illustrated in FIG. 14 allows the use of the device DIS either in a conventional mode of operation, for example wired, in which the non-volatile writing (or transfer) is effected in a single pass, or in a second mode of operation, for example compatible with the use of the device DIS in a chip of contactless type, in which the non-volatile writing is effected by block.

In practice, as illustrated in FIG. 14, a block of memory cells $BLC_q$ has several rows of memory cells of the memory map PM.

Thus, in the present case, for a memory map of N columns and P rows, a block $BLC_q$ has N×Q memory cells arranged over N columns and Q rows.

There are thus P/Q blocks. Q may be equal to 4, for example.

In relation to the embodiment in FIG. 13, each block has a first control line CGLB and a second control line PRLB. These P/Q lines CGLB and these P/Q lines PRLB are individualized from the global lines CGL and PRL after passing through the decoder DCDY.

Of course, each line CGLB is subdivided into elementary lines respectively associated with the rows of memory cells in the block. The same applies to the line PRLB.

This subdivision of the lines CGL and PRL into P/Q lines CGLB and into P/Q lines PRLB is necessary in order to allow the block non-volatile storage function. Indeed, it is thus necessary to decode the sending of the high voltage (lines CGL) locally in the memory map. In other words, at a given instant of non-volatile writing, some cells will receive high voltage, and others will not.

This being the case, at a given instant, all memory cells in the same block are in the same mode, namely either a read and write mode of SRAM type, or in a write mode for the groups of non-volatile elementary memory cells.

In order to authorize operation of the device DIS in dual operation (that is to say in a first mode of operation, for example of wired type, or in a second mode of operation, for example of contactless type), provision is made for controllable configuration means MCOF incorporated into the control block BLG1 in this case.

These configuration means MCOF have a first state in which they are capable of putting all memory cells of the memory map, that is to say all memory cells of all blocks, either into a read or write mode of SRAM type, or into a non-volatile write mode.

In a first state of this kind, the decoder Y simultaneously decodes all lines CGLB and PRLB. The mode of operation is similar to that in FIG. 13.

The configuration means MCOF moreover have a second state, in which they are capable of selectively putting, on a block-by-block basis, all memory cells of a block either into a read or write mode of SRAM type, or into a non-volatile write mode.

More precisely, during volatile operation of the block (SRAM), the lines CGLB and PRLB are at 0 volt, while during non-volatile writing to the block, the line PRLB is in the high logic state (for example voltage Vdd) while the line CGLB is intended to receive the write (erase/programming) voltage.

The programming current that the charge pump needs to provide is proportional, in the first order, to the number of simultaneously programmed cells. In this case, it is thus divided by the number of blocks.

In the embodiment of FIG. 15, it is supposed that the device DIS has reception means MRCP that are configured to receive successive blocks of data. There are thus advantageously provided management means MGST, for example a state machine, which is configured to put the configuration means MCOF into their second state (step 140), then to store (step 141) a current block of data $BLD_q$ in the elementary memory cells of SRAM type of the memory cells of a block $BLC_q$ of memory cells, then to carry out a non-volatile write cycle for writing the data that have thus been written to the SRAM cells to the non-volatile elementary memory cells (step 142), and, at the same time as this non-volatile writing, to store the next block of data $BLC_{q+1}$ in the elementary memory cells of SRAM type of memory cells of another block of memory cells, for example the next block $BLC_{q+1}$.

Thus, by way of example, if it is supposed that the blocks of data are blocks of 512 bits, the non-volatile writing to such a block lasts approximately 4 milliseconds at the same time as the next 512 bits stored in a different block are received. Furthermore, with a speed of 106 kb/second for a radio-frequency exchange in accordance with the standard ISO/IEC 14 443B, this reception takes 4.83 milliseconds.

It can thus be observed that the non-volatile writing to a block is faster than an SRAM data transfer to the next block. The non-volatile writing is therefore transparent.

Thus, such an embodiment is transparent vis-à-vis the preferred wired mode of operation, and allows a reduction typically by a factor greater than 10 in non-volatile storage consumption during radio-frequency exchanges, this non-volatile storage being transparent during the radio-frequency exchanges.

In a general manner, for the operation of the SRAM elementary memory cell (reading or writing or reloading from the EEPROM cell), the minimum value of the supply voltage Vdd is approximately 1.2 volts.

For non-volatile storage or transfer, the minimum value of Vdd is 2 to 3 volts in order to allow good selectivity for the erase cycle.

If the overall voltage Vdd of the circuit is 1.2 volts, the 2 to 3 volts are obtained by means of pumping during non-volatile cycles. However, pumping of the voltage Vdd is necessary only for the block undergoing non-volatile writing, the other blocks being able to preserve the overall lower and unpumped value Vdd.

Consequently, in order to reduce the power consumed for non-volatile writing, it is advantageous for the pumped voltage Vdd to be applied only to the block receiving non-volatile writing. This reduces the charge seen by the charge pump generating the voltage Vdd of 3 volts.

Consequently, an embodiment is provided (FIG. 16) in which, in relation to the embodiment in FIG. 14, the decoder DCDY receives the pumped voltage Vdd and directs it specifically to a block among the P/Q, this block being the one performing non-volatile writing. The other blocks receive the unpumped overall supply voltage Vdd.

Generally, upon power-up, the whole memory map is supplied with power (in fact the whole SRAM memory map, since the non-volatile cells are not supplied with power) so as to put all elementary memory cells of SRAM type into a known reinitialized state and to reload (at the same time or subsequently) the data contained in the non-volatile elementary memory cells into the associated SRAM elementary memory cells.

These two steps both consume current, and therefore the consumption of the circuit risks being at a maximum upon power-up, which may be annoying when the product is a specified low-consumption product or when the memory device is inserted into a contactless chip capable of talking to a contactless reader, for example on a radio-frequency carrier.

Figure 17:
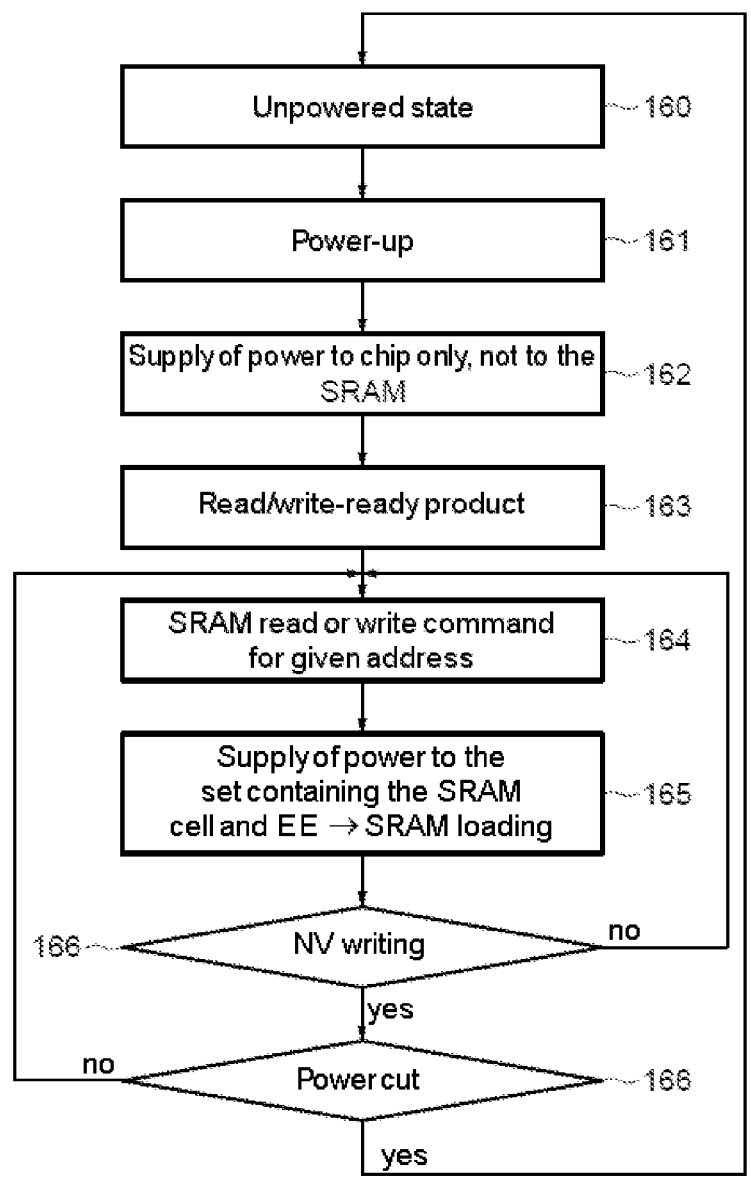
FIG. 17 illustrates a method of operation of a memory device.
Figure 18:
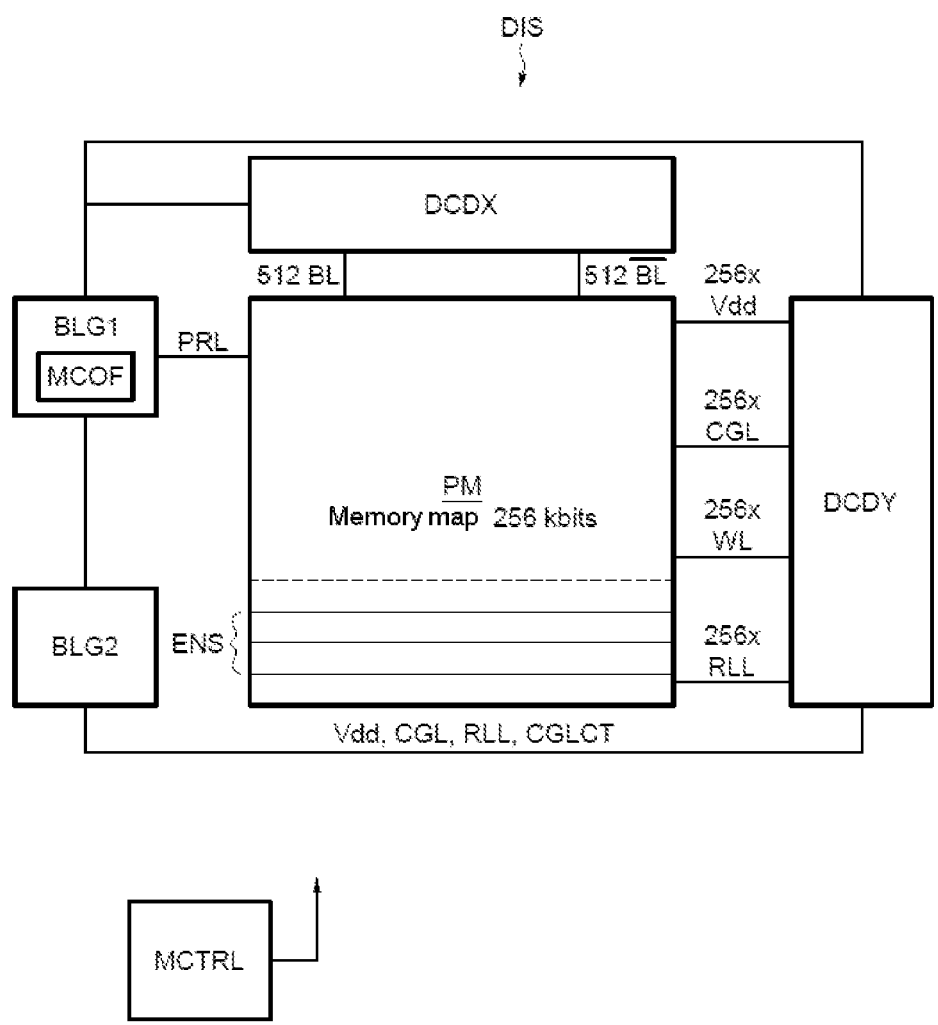
FIG. 18 provides a block diagram of a memory device.
Figure 19:
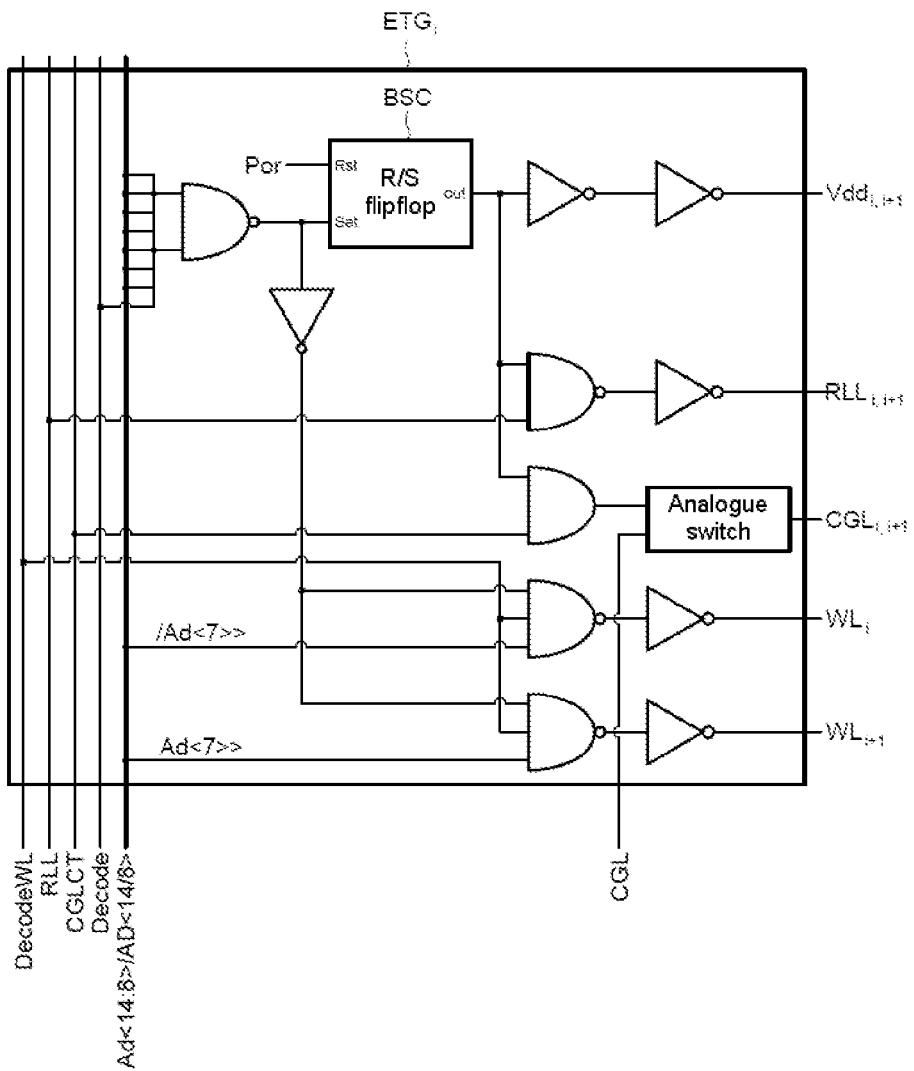
FIG. 19 provides details of a portion of a memory device.

The embodiment and implementation illustrated in FIGS. 17 to 19 is particularly compatible with a low-consumption constraint.

Figure 16:
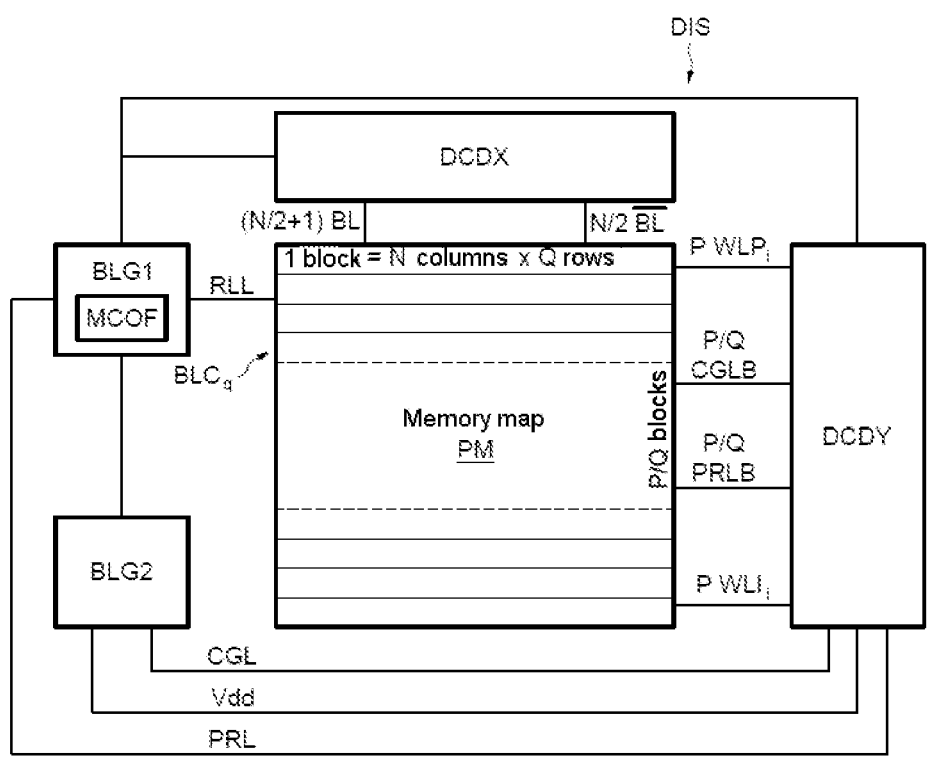

More precisely, as illustrated in FIG. 16, when the chip incorporating the memory device is in an unpowered state (step 160), the chip alone is supplied with power (step 162) but the memory map is not supplied with power, following power-up (step 161), regardless of whether this power-up be an initial power-up or else a power-up subsequent to a power cut.

Following this supply of power (step 162), the device is ready for the reading/writing from/to the SRAM elementary memory cells (step 163).

In the presence of a read or write command for an SRAM elementary memory cell at a given address (step 164), the set of memory cells containing the SRAM cell in question is then supplied with power (step 165) and the reloading of this SRAM elementary memory cell in question with the content of the non-volatile elementary memory cells associated therewith and the reloading of all other SRAM elementary memory cells of the set are authorized.

As will be seen in more detail below, this set of memory cells may have two rows of memory cells, for example.

It is worth noting at this juncture that reloading of the set of SRAM memory cells (the two rows, for example) prior to writing to an SRAM memory cell is likewise advantageously effected so as to prevent the other SRAM memory cells in the pair of rows from being in a metastable state.

At the conclusion of this reloading (step 165), it is possible optionally to carry out non-volatile writing (step 166) to the non-volatile elementary memory cells, and, in the case of a new power cut (step 167), there is a return to the unpowered state (step 160), whereas there is a return to state 163 in the absence of a power cut (step 67).

As illustrated in FIG. 18, the device DIS according to this embodiment has control means MCTRL configured to carry out notably steps 162 and 165.

In the example illustrated, the memory map PM is a memory map of 256 kbits having 512 rows of memory cells and 512 columns of memory cells.

In this example, the bit lines BL and the complementary bit lines $\overline{BL}$ are not shared between adjacent cells. There are therefore 512 bit lines BL and 512 bit lines $\overline{BL}$.

On the other hand, in this example, the control lines CGL and the supply lines Vdd are shared between two adjacent rows of cells, in the same way as the control lines RLL. Two adjacent rows form the set ENS of memory cells.

Following passage through the decoder DCDY, the lines Vdd, CGL and RLL are thus subdivided into 256 corresponding lines.

After decoding DCDY, there are likewise 512 word lines $WL_i$.

On the other hand, since the non-volatile elementary cells are programmed from the SRAM memory cells in a single pass, there still remains a single control line PRL.

Thus, as explained above, any access to an address brings about prior power-up of the supply line Vdd assigned to this address and the parallel reloading of the data contained in the non-volatile memories into the SRAM memories associated with all cells coupled to this supply line. This may thus be transparent in a serial access protocol.

There is thus selective and progressive reloading of the SRAM memory map as a function of the accessed data.

The row decoder DCDY in this case has 256 stages $ETG_i$ such as the one illustrated schematically by way of nonlimiting example in FIG. 19.

More precisely, each stage receives the signal RLL, a logic signal CGLCT for controlling the first control lines CGL, the voltage CGL in the strict sense, a logic signal DecodeWL for decoding the word lines, an activation signal Decode and the address bytes. The stage $ETG_i$ notably has an R/S flipflop referenced BSC, the Set input of which receives the address bytes via a logic gate.

The signal POR (Power On Reset) received at the Rst input of the flipflop is an internally generated reinitialization signal that reinitializes all various registers and memory storage systems. It is conventionally generated when the supply voltage rises.

Other logic gates and inverters allow delivery of the signals $Vdd_{i,i+1}$, $RLL_{i,i+1}$, $CGL_{i,i+1}$ for the lines i and i+1, as well as the signals $WL_i$ and $WL_{i+1}$ for the corresponding word lines.

The control voltage CGL is delivered directly to the analogue switch coupled downstream of its AND control logic gate receiving the logic signal CGLCT at one of its inputs.

The chronology is as follows.

Upon power-up, no power is supplied to the SRAM memory map. All output signals from the stages $ETG_i$ are at zero.

A read command is translated into series by a specific code (opcode) and then in this case by two address bytes.

Upon reception of an address, the signal Decode and a pulse at the "set" input of the flipflop BSC are activated.

The result of this is a definitive rise in the signal Vdd from two physical rows, as well as the rise in the signals RLL and CGL from these two physical rows.

Next, the data contained in the non-volatile elementary memory cells are reloaded into the SRAM elementary cells of the two rows.

At the end of the reloading, the lines CGL and RLL return to "0".

Such an embodiment allows overconsumption to be distributed over time, instead of having a consumption peak for the total reloading of the SRAM memory map with the content of the non-volatile elementary memories.

Moreover, it is quite possible to combine the embodiments of FIGS. 14 and 18, that is to say to have a memory device in which the elementary memory cells CELSR can be transferred to the non-volatile elementary memory cells in blocks while the elementary memory cells CELSR can be reloaded on a row-by-row basis, for example.

The memory device that has just been described may, in all of its variant embodiments, be part of an integrated circuit, for example, but not restrictively incorporated within a chip of a contactless product, for example a contactless chip card.

What is claimed is:

1. A memory device comprising:
    an SRAM-type elementary memory cell having first and second inverter coupled to one another crosswise;
    a first non-volatile memory unit having a first non-volatile elementary memory cell with a first floating-gate transistor, the first floating-gate transistor having
        a first conduction electrode directly connected to a supply terminal,
        a control electrode coupled to a first control line, and
        a second conduction electrode;
    a second non-volatile memory unit having a second non-volatile elementary memory cell with a second floating-gate transistor, the second floating-gate transistor having
        a first conduction electrode directly connected to the supply terminal,
        a control electrode coupled to the first control line, and
        a second conduction electrode;
    a controllable interconnection stage with a first portion coupled between the second conduction electrode of the first floating-gate transistor and an output of the first inverter and a second portion coupled between the second conduction electrode of the second floating-gate transistor and an output of the second inverter; and
    a control circuit configured to cause the first and second floating-gate transistors to turn off when a data item stored in the SRAM-type elementary memory cell is differentially programmed into the first and second non-volatile memory units.

2. The device according to claim 1, further comprising a first negative control voltage terminal that is coupled to the first control line during the differential programming.

3. The device according to claim 1, wherein the first and second floating-gate transistors and the interconnection stage are coupled so as to selectively confer a written state on the first non-volatile elementary memory cell and an erased state on the second non-volatile elementary memory cell, after completion of the differential programming.

4. The device according to claim 3, wherein the output of the first inverter is in a high logic state and the output of the second inverter is in a low logic state based on a logic value of the data item stored in the SRAM-type elementary cell.

5. The device according to claim 3, wherein, during an operation of reloading a data item programmed differentially in the two first and second non-volatile elementary memory units into the SRAM-type elementary memory cell, the first and second floating-gate transistors are configured so that the first floating-gate transistor is on and the second floating-gate transistor is off.

6. The device according to claim 1, wherein the interconnection stage comprises:
    a second control line;
    a third control line;
    a first interconnection transistor with a current path coupled between the second conduction electrode of the first floating-gate transistor and the output of the first inverter and a control electrode coupled to the second control line;
    a second interconnection transistor with a current path coupled between the second conduction electrode of the second floating-gate transistors and the output of the second inverter and a control electrode coupled to the second control line;
    a third interconnection transistor with a current path coupled between the second conduction electrode the first floating-gate transistor and an input of the first inverter and a control electrode coupled to the third control line; and
    a fourth interconnection transistor with a current path coupled between the second conduction electrode the second floating-gate transistor and an input of the second inverter and a control electrode coupled to the third control line.

7. The device according to claim 6, wherein, during the differential programming, the second control line coupled to receive a second control voltage turning on the first and second interconnection transistors and the third control line is coupled to receive a third control voltage turning off the third and fourth interconnection transistors and, during a reloading operation, the second control line is coupled to receive a second control voltage turning off the first and second interconnection transistors and the third control line is coupled to receive a third control voltage turning on the third and fourth interconnection transistors.

8. The device according to claim 1, wherein the supply terminal is held at a ground potential during operation.

9. The device according to claim 1, wherein each non-volatile elementary memory cell is a cell of EEPROM type.

10. The device according to claim 1, wherein the memory device includes a plurality of memory cells, each memory cell comprising:
    an SRAM-type elementary memory cell having first and second inverter coupled to one another crosswise;

a first non-volatile memory unit having a first non-volatile elementary memory cell with a first floating-gate transistor, the first floating-gate transistor having a first conduction electrode coupled to a supply terminal, a control electrode coupled to a first control line, and a second conduction electrode; and a second non-volatile memory unit having a second non-volatile elementary memory cell with a second floating-gate transistor, the second floating-gate transistor having a first conduction electrode coupled to the supply terminal, a control electrode coupled to the first control line, and a second conduction electrode; and a controllable interconnection stage with a first portion coupled between the second conduction electrode of the first floating-gate transistor and an output of the first inverter and a second portion coupled between the second conduction electrode of the second floating-gate transistor and an output of the second inverter.

11. The device according to claim 10, comprising a memory map containing the plurality of memory cells, which are organized into blocks of cells, the device further comprising control circuitry configured to operate in a first state, in which the control circuitry is capable of putting all memory cells of the memory map either into a read or write mode of SRAM type or into a write mode for the groups of non-volatile elementary memory cells; and a second state, in which the control circuitry is capable of selectively putting, on a block-by-block basis, all memory cells of a block either into a read or write mode of SRAM type or into a write mode of the groups of non-volatile elementary memory cells.

12. The device according to claim 11, further comprising a receiver configured to receive successive blocks of data and management circuitry configured to put the control circuitry into the second state;

store a current block of data in the SRAM-type elementary memory cells of the memory cells of a block of memory cells;

then carry out a non-volatile write cycle for writing the data thus written to the SRAM-type elementary cells to the non-volatile elementary memory cells of the memory cells of the block of cells; and at the same time as the non-volatile write cycle, store the next block of data in the SRAM-type elementary memory cells of the memory cells of another block of memory cells.

13. The device according to claim 11, wherein the memory map contains the plurality of memory cells organized into two rows and columns, and each block of memory cells has several rows of memory cells.

14. The device according to claim 1, wherein each non-volatile elementary memory cell further comprises an isolation stage having a fourth control line and an isolation transistor coupled between the first conduction electrode of the respective floating-gate transistor and the supply terminal, the control electrodes of all isolation transistors being coupled to the fourth control line.

15. The device according to claim 14, comprising a memory map containing the plurality of memory cells and control circuitry configured so as, when power is supplied to the device, not to supply power to the memory map and to authorize a supply of power to a set of at least one memory cell and reloading the SRAM-type elementary memory cell of the at least one memory cell with a content of the non-volatile elementary memory cells, only during addressing of the SRAM-type elementary memory cell.

16. The device according to claim 15, wherein the set has more than one memory cell and the control circuitry is configured so as, during the supply of power to the device, not to supply power to the memory map and to authorize the supply of power to the set of memory cells and reloading of all the SRAM-type elementary memory cells of the set of memory cells with a content of the corresponding non-volatile elementary memory cells, only during the addressing of at least one SRAM-type elementary memory cell of the set.

17. The device according to claim 16, wherein the memory map contains the plurality of memory cells organized into rows and columns, and the set of memory cells has at least one row of memory cells.

18. A memory device, comprising:

a first SRAM-type elementary memory cell having two inverters coupled to one another crosswise; and two groups, each group having at least two parallel-coupled non-volatile elementary memory cells, the non-volatile elementary memory cells of the two groups being coupled firstly to a supply terminal and secondly to outputs and to inputs of the two inverters via a controllable interconnection stage, wherein each non-volatile elementary memory cell includes a floating-gate transistor, each floating-gate transistor of each non-volatile elementary memory cell including a first conduction electrode directly connected to the supply terminal, a second conduction electrode, and a control electrode coupled to a first control line.

19. The device according to claim 18, wherein the controllable interconnection stage comprises a second control line;

a third control line;

two first interconnection transistors respectively coupled between second conduction electrodes of the floating-gate transistors of the non-volatile elementary memory cells of the two groups and outputs of the two inverters of the SRAM-type elementary memory cell, and having a control electrode coupled to the second control line; and two second interconnection transistors respectively coupled between the second conduction electrodes of the floating-gate transistors of the non-volatile elementary memory cells of the two groups and inputs of the two inverters of the SRAM-type elementary memory cell, and having a control electrode coupled to the third control line.

20. The device according to claim 19, wherein each group comprises a pair of non-volatile elementary memory cells coupled in parallel and wherein the controllable interconnection stage further comprises two first transistors having shorted conduction electrodes respectively coupled in series with the two first interconnection transistors and each having a control electrode coupled to the third control line, and two second transistors having shorted conduction electrodes respectively coupled in series with the two second interconnection transistors and each having a control electrode coupled to the second control line.

21. The device according to claim 18, comprising a memory map containing a plurality memory cells organized into rows and columns, bit lines and complementary bit lines common to the memory cells of at least some pairs of adjacent columns of cells, two different word lines associated with each row of cells, access transistors of the SRAM-type elementary cells of the memory cells being respectively coupled to the corresponding common bit lines and complementary bit lines, and control electrodes of the two pairs of access transistors of two adjacent cells of SRAM type are respectively coupled to the two different word lines.

22. A method of operating a memory device that comprises:
- a first SRAM-type elementary memory cell having two inverters coupled to one another crosswise;
- two groups, each group having a non-volatile elementary memory cell, the non-volatile elementary memory cells of the two groups being coupled firstly to a supply terminal and secondly to outputs and to inputs of the two inverters via a controllable interconnection stage, wherein each non-volatile elementary memory cell includes a floating-gate transistor, all floating-gate transistors having a first conduction electrode coupled to the supply terminal and a control electrode coupled to a first control line;
- wherein the controllable interconnection stage comprises
  - a second control line;
  - a third control line;
  - two first interconnection transistors respectively coupled between second conduction electrodes of the floating-gate transistors of the non-volatile elementary memory cells of the two groups and outputs of the two inverters of the SRAM-type elementary memory cell, and having a control electrode coupled to the second control line; and
  - two second interconnection transistors respectively coupled between the second conduction electrodes of the floating-gate transistors of the non-volatile elementary memory cells of the two groups and inputs of the two inverters of the SRAM-type elementary memory cell, and having a control electrode coupled to the third control line;
- wherein the method comprises writing a data item stored in the SRAM-type elementary memory cell to the two groups of non-volatile elementary memory cells of the memory cell, the method comprising an erase cycle for the groups of non-volatile elementary memory cells followed by a differential programming cycle;
- wherein the erase cycle comprises:
  - turning on the first interconnection transistors by applying a control voltage to the second control line;
  - turning off the second interconnection transistors by applying a control voltage to the third control line; and
- wherein the differential programming cycle comprises:
  - turning off the floating-gate transistor for each non-volatile elementary memory cell by applying a programming voltage to the first control line, wherein the floating-gate transistor for each non-volatile elementary memory cell is turned off during an entirety of the differential programming cycle; and then
  - stopping application of the programming voltage to the first control line so as to put the at least one non-volatile elementary memory cell of one of the groups into a written state and the at least one non-volatile elementary memory cell of the other group into an erased state.

23. The method according to claim 22, wherein at least one of the programming voltages comprises a negative programming voltage.

24. The method of claim 22, further comprising reloading into the SRAM-type elementary memory cell of the memory cell a data item programmed by the differential programming cycle, the reloading comprising:
- turning off the first interconnection transistors;
- turning on the second interconnection transistors; and
- turning on the floating-gate transistor of the at least one non-volatile elementary memory cell in the written state and turning off the floating-gate transistor of the at least one non-volatile elementary memory cell in the erased state.

25. The method according to claim 22, wherein the memory cell further comprises an isolation stage having a fourth control line and isolation transistors respectively coupled between the first conduction electrode of each floating-gate transistor and the supply terminal, control electrodes of all isolation transistors being coupled to the fourth control line, wherein the erase cycle comprises:
- turning on the first interconnection transistors;
- turning off the second interconnection transistors;
- turning off the isolation transistors; and
- turning on the floating-gate transistors by applying an erase voltage to the first control line.

26. The method of claim 25, further comprising reloading into the SRAM-type elementary memory cell a data item programmed by the differential programming cycle, the reloading comprising:
- turning off the first interconnection transistors;
- turning on the second interconnection transistors;
- turning on the isolation transistors; and
- turning on the floating-gate transistor of the at least one non-volatile elementary memory cell in the written state and turning off the floating-gate transistor of the at least one non-volatile elementary memory cell in the erased state.

* * * * *